(12) United States Patent
Yamada et al.

(10) Patent No.: US 7,463,491 B2
(45) Date of Patent: Dec. 9, 2008

(54) WIRING BOARD AND A SEMICONDUCTOR DEVICE USING THE SAME

(75) Inventors: Hiroshi Yamada, Yokohama (JP); Keiji Takaoka, Kawasaki (JP); Hideto Furuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/707,106

(22) Filed: Feb. 16, 2007

(65) Prior Publication Data
US 2007/0151752 A1 Jul. 5, 2007

Related U.S. Application Data

(62) Division of application No. 10/899,154, filed on Jul. 27, 2004.

(30) Foreign Application Priority Data
Jul. 28, 2003 (JP) ............................ 2003-202491

(51) Int. Cl.
*H05K 7/00* (2006.01)
(52) U.S. Cl. .................. 361/777; 359/238; 359/248
(58) Field of Classification Search .......... 361/777, 361/803, 744; 174/254; 359/238, 248
See application file for complete search history.

(56) References Cited

U.S. PATENT DOCUMENTS

| 6,330,377 | B1 | 12/2001 | Kosemura |
| 6,517,257 | B2 * | 2/2003 | Nishikawa et al. ............ 385/88 |
| 6,977,820 | B2 * | 12/2005 | Uchida ........................ 361/761 |
| 7,015,570 | B2 * | 3/2006 | Emma et al. ................. 257/685 |
| 2002/0048436 | A1 * | 4/2002 | Nishikawa et al. ............ 385/88 |

FOREIGN PATENT DOCUMENTS

| JP | 61-79290 | 4/1986 |
| JP | 2001-083346 | 3/2001 |
| JP | 2001-183556 | 7/2001 |
| JP | 2001-318250 | 11/2001 |
| JP | 2002-040274 | 2/2002 |
| JP | 2002-182049 | 6/2002 |
| JP | 2002-237684 | 8/2002 |
| JP | 2002-258117 | 9/2002 |
| JP | 2003-179361 | 6/2003 |

OTHER PUBLICATIONS

"Birudoappu taso purinto haisenban gijutsu" (Build-up multilayer printed wiring board technology), pp. 67-83, The Nikkan Kogyo Shimbun, Ltd., 2000.

Notification of Reasons for Refusal issued by the Japanese Patent Office on May 23, 2006, for Japanese Patent Application No. 2003-202491, and English-language translation thereof.

* cited by examiner

*Primary Examiner*—Dean A. Reichard
*Assistant Examiner*—Abiy Getachew
(74) *Attorney, Agent, or Firm*—Finnegan, Henderson, Farabow, Garrett & Dunner, L.L.P.

(57) ABSTRACT

A wiring board includes a core composite layer having first and second core boards and an optical transmission portion; first electrodes disposed on one part of the core composite layer, being adapted to mount an optical semiconductor module on the core composite layer; upper and lower core board wirings disposed on another part of and beneath the core composite layer; and upper and lower build-up wirings stacked on the upper and lower core board wirings, being adapted to mount semiconductor modules.

10 Claims, 13 Drawing Sheets

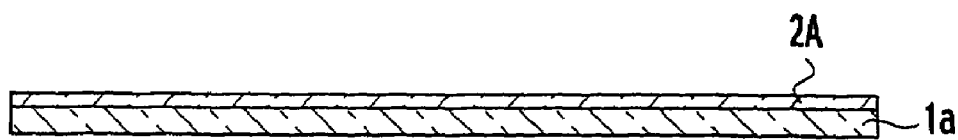
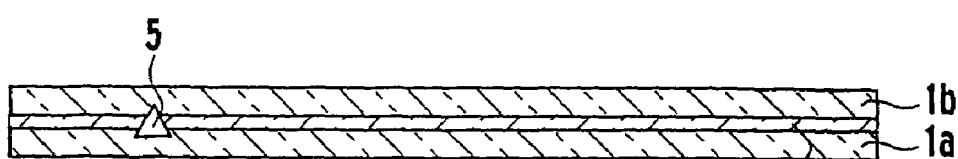
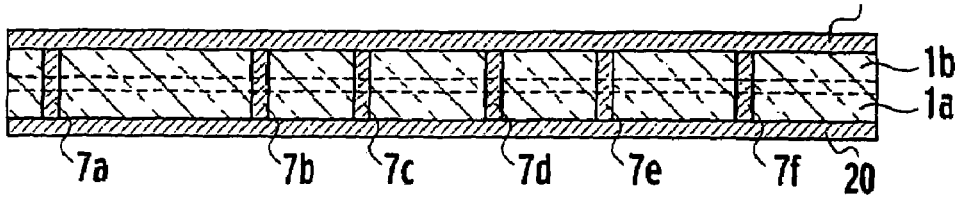
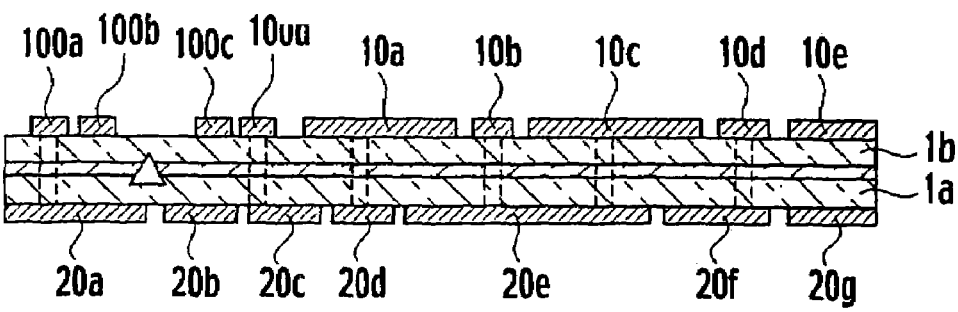
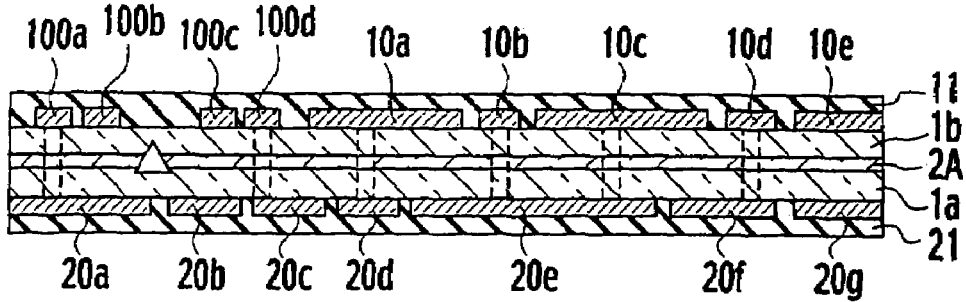
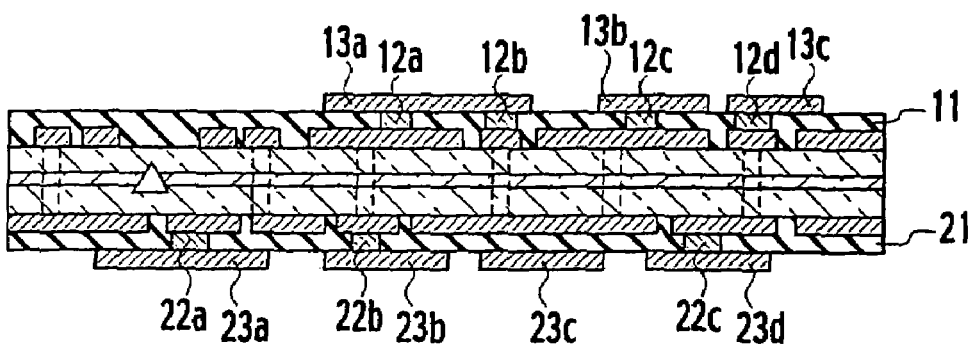

WIRING BOARD AND A SEMICONDUCTOR DEVICE USING THE SAME

CROSS REFERENCE TO RELATED APPLICATIONS

This is a divisional of application Ser. No. 10/899,154, filed on Jul. 27, 2004, which claims the benefit of priority to Japanese Patent Application No. 2003-202491, filed on Jul. 28, 2003, all of which are incorporated herein by reference in their entireties.

BACKGROUND OF THE INVENTION

1. Field of the Invention

The present invention relates to a semiconductor device, more specifically to a wiring board in which an electric wiring layer and an optical wiring layer are stacked on a board, and to a semiconductor device using the wiring board.

2. Description of the Related Art

As long-distance and high-capacity optical fiber transmission systems have been rapidly widespread, optical transmission technology with a capacity ranging from gigabits to terabits is being researched and developed at present. Particularly, in an optical subscriber system in the Fiber to the Home (FTTH), research for reducing manufacturing cost of an optical device module, and the like, is attempted in order to generalize the module. Specifically, there has been proposed a method of forming a V-shaped groove on a silicon substrate to facilitate the alignment of a semiconductor device with an optical fiber, and a coupling technology of the semiconductor device and the optical fiber by using a passive alignment method.

Also with regard to an LSI, much research has been conducted for enhancing performance thereof, and the operating speed and integration scale of the LSI tend to be significantly improved. It is known that a challenge on improving the performance of the LSI is the enhancement of transfer rate and packaging density in signal wiring. In other words, even if the performance of a functional device such as a transistor is enhanced, it is difficult to enhance the performance of the module unless the enhancement of the signal transfer rate and packaging density in the signal wiring is achieved. However, a delay in signal transmission is inherent in the electric signal wiring, causing a hindrance to the enhancement of the module performance. Furthermore, when the signal transfer rate and the packaging density of the signal wiring are enhanced, influence of the electromagnetic interference (EMI) significantly appears, and accordingly, it is necessary to take sufficient measures against the EMI.

As for solving such a problem regarding the electric signal wiring, optical interconnection technology is regarded as prospective. It is thought that this optical interconnection technology is applicable to many purposes such as interconnecting electronic instruments mutually, boards in the electronic instruments mutually, and chips in the boards mutually. For example, there is proposed a technology utilizing a plastic optical fiber which has a large core diameter and is easy to connect as an optical interconnection technology between the electronic instruments, a technology utilizing a flexible optical waveguide as an optical interconnection technology in the electronic instrument, or a technology utilizing the optical wave guide and optical wiring as an optical interconnection technology between the chips in the board.

In the optical interconnection technology which is effective as a next-generation high-density and high-speed communication technology, enhancement of packaging density and improvement of connection reliability in a wiring board including both of an electric wiring layer and an optical wiring layer become important. However, it has been common that, in an earlier electro-optical wiring board, the optical waveguide is formed on a multilayer wiring layer deposited on a circuit wiring board or between the multilayer wiring layers. For this reason, though no problem occurs when the thickness of the circuit wiring board serving as a support member of the optical waveguide is relatively thick, the board is deformed due to a difference in thermal expansion coefficient between the material of the optical wave guide and the material of the circuit wiring board when it is necessary to reduce the thickness of the circuit wiring board as in the case where the board is used for a mobile electronic instrument. As a result of this, a warp occurs in the optical waveguide formed on the circuit board, which causes difficulty in optically aligning the optical waveguide with an optical semiconductor module to be mounted on the circuit board. Moreover, when the optical waveguide and the multilayer wiring board, which are made of materials different in coefficient of thermal expansion, are expanded due to heat generated in the optical semiconductor module, the problem of the destruction of the board occurs. The destruction problem of the board affects a connection part of the circuit wiring board and a semiconductor module having the semiconductor device mounted thereon.

Meanwhile, with regard to an earlier semiconductor device mounting an optical semiconductor module on the wiring board, a semiconductor device, in which the optical semiconductor module is mounted on the upper most stage of the multilayer wiring layer deposited on the circuit wiring board is common. However, when the number of stacked layers of the wiring is increased, the uppermost stage of the wiring layer is deformed to a great extent, causing irregularities on the surface of the wiring layer. Accordingly, in some cases, the optical semiconductor module and the wiring board cannot be sufficiently coupled to each other. In the case of using the wiring board in which the optical waveguide is arranged between the multilayer wirings, it is necessary to arrange the optical waveguide in a portion on which a semiconductor device transferring an electric signal is not mounted. Accordingly, limitations are inherent in enhancement of a wiring density of the entire electro-optical wiring board because of layout rate determination of the optical wiring layer, which is difficult to miniaturize compared with electric wiring.

SUMMARY OF THE INVENTION

An aspect of the present invention inheres in a wiring board encompassing a core composite layer including a first core board, an optical transmission portion disposed on the first core board, and a second core board disposed on the optical transmission portion; a plurality of first electrodes disposed on one part of the core composite layer, being adapted to mount an optical semiconductor module on the first electrodes, the optical semiconductor module is optically connectable to the optical transmission portion through a gap between the first electrodes; upper and lower core board wirings disposed on another part of and beneath the core composite layer, respectively; and upper and lower build-up wirings stacked on the upper and lower core board wirings, respectively, having second electrodes being adapted to mount semiconductor modules, respectively.

Another aspect of the present invention inheres in a wiring board encompassing a core composite layer including a lower optical transmission portion, a core board disposed on the lower transmission portion, and an upper optical transmission portion disposed on the core board; a plurality of first electrodes disposed on one part of the core composite layer, being adapted to mount an optical semiconductor module on the first electrodes, the optical semiconductor module is optically connectable to at least one of the upper and lower optical transmission portions through a gap between the first electrodes; upper and lower core board wirings disposed on another part of and beneath the core composite layer, respectively; and upper and lower build-up wirings stacked on the upper and lower core board wirings, respectively, having second electrodes being adapted to mount semiconductor modules, respectively.

Still another aspect of the present invention inheres in a semiconductor device encompassing a core composite layer including a core board and an optical transmission portion; a plurality of first electrodes disposed on one part of the core composite layer; an optical semiconductor module having a module board made from the same material as the core board disposed on the first electrodes and being connected optically to the optical transmission portion; upper and lower core board wirings disposed on another part of and below the core composite layer, respectively; upper and lower build-up wirings stacked on the upper and lower core board wirings, respectively, each having a second electrode; and upper and lower semiconductor modules disposed on the second electrodes of the upper and lower build-up wirings, respectively.

BRIEF DESCRIPTION OF DRAWINGS

FIGS. 3-13 are cross-sectional views showing a method of manufacturing the semiconductor device according to the first embodiment of the present invention.

DETAILED DESCRIPTION OF THE INVENTION

Figure 1:
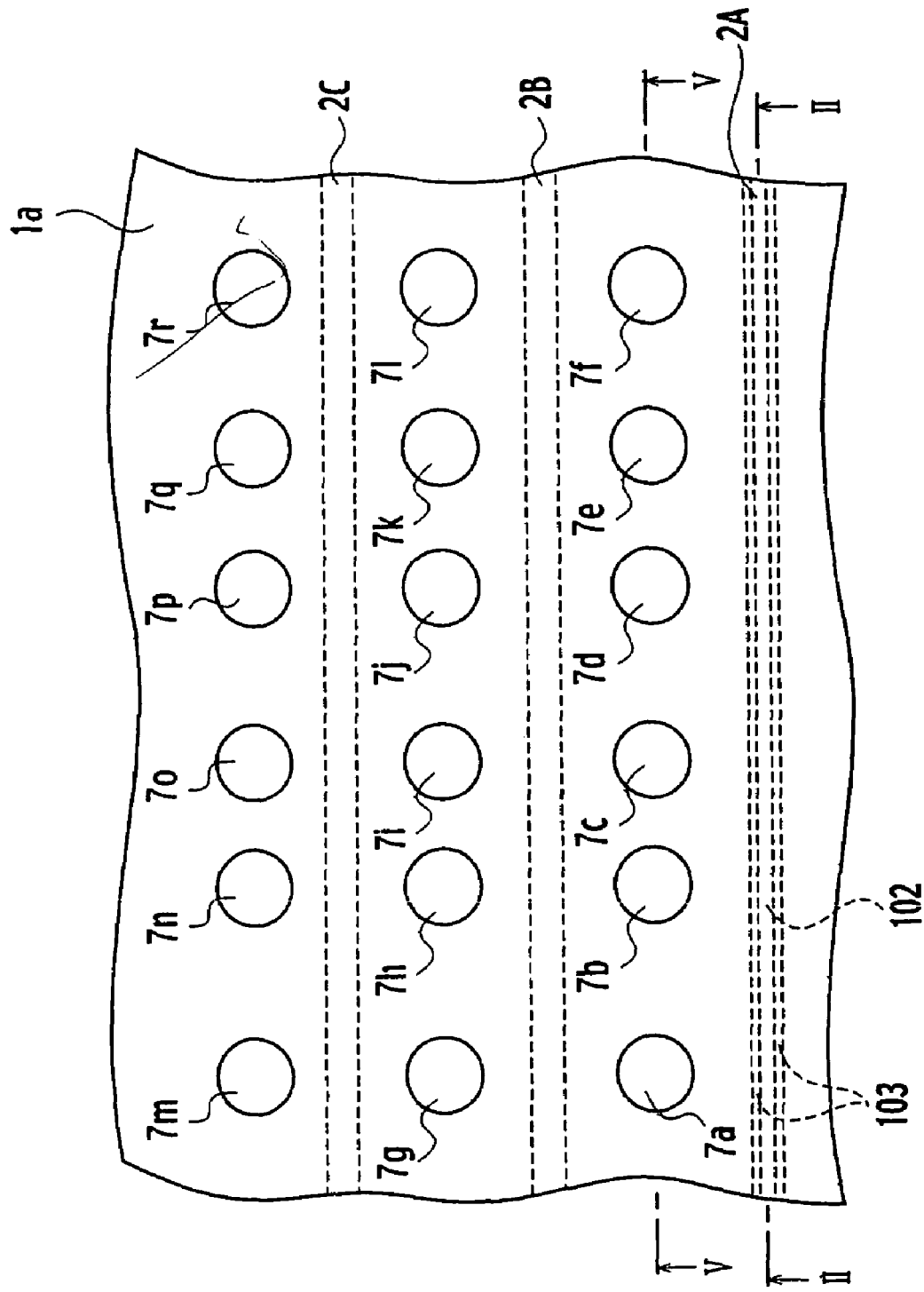
FIG. 1 is a plane view showing the arrangement relationship between an optical wiring and a through hole of the semiconductor device according to the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. However, it will be obvious to those skilled in the art that the present invention may be practiced without such specific details.

First Embodiment

Figure 2:
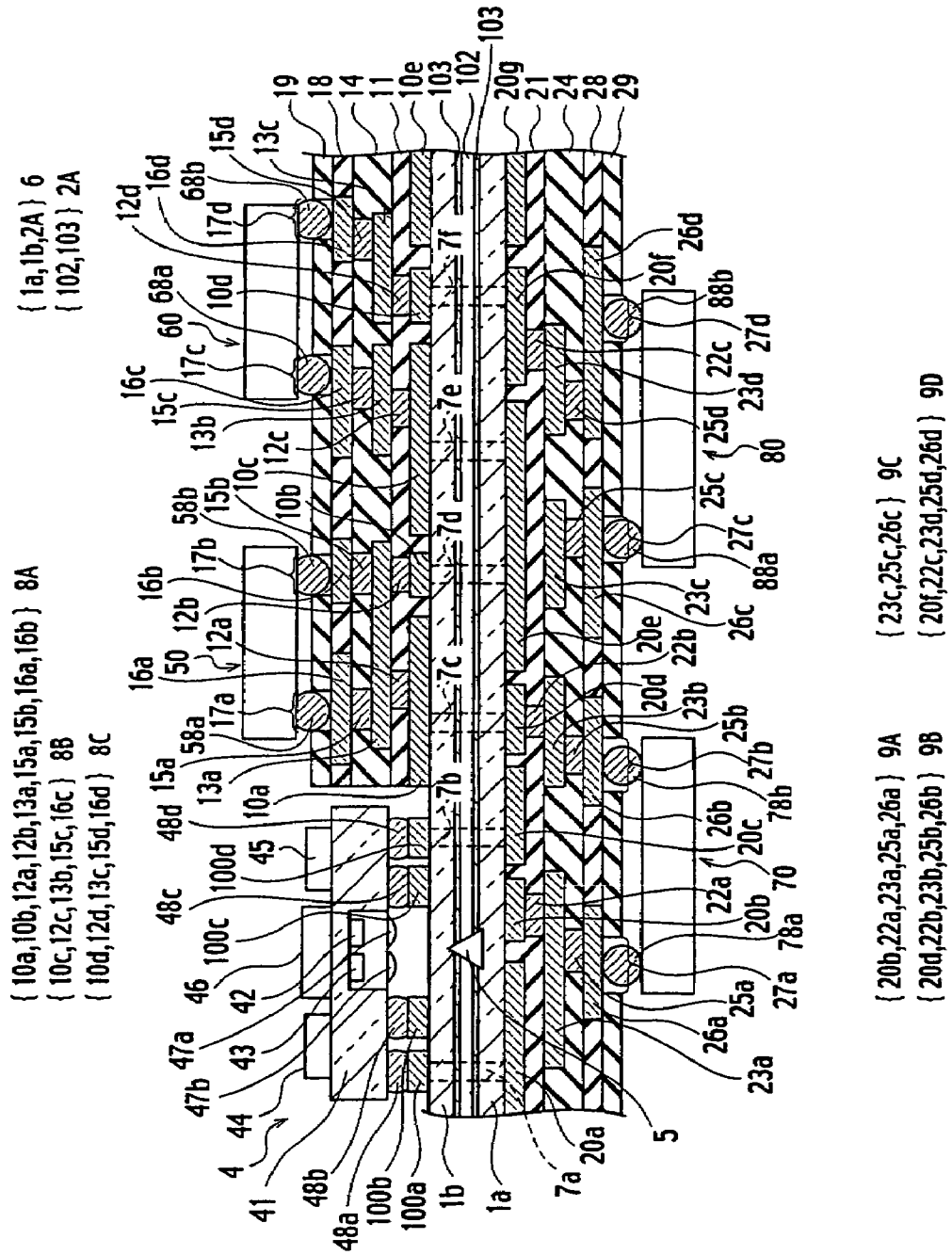
FIG. 2 is a cross-sectional view taken on line II-II in FIG. 1, showing an example of a semiconductor device according to the first embodiment of the present invention.

As shown in FIG. 2, a semiconductor device according to a first embodiment of the present invention includes a core composite layer 6 having a first core board 1a, optical wirings 2A, 2B and 2C (for the optical wirings 2B and 2C, refer to FIG. 1) arranged on an upper surface of the first core board 1a, and a second core board 1b arranged above the first core board 1a with the optical wirings 2A, 2B and 2C interposed therebetween. On an upper surface of the second core board 1b, an optical semiconductor module 4 is mounted. On another region of the upper surface of the second core board 1b on which the optical semiconductor module 4 is mounted, upper core board wirings 10a, 10b, 10c, 10d and 10e are arranged. On the upper core board wirings 10a, 10b and 10d, upper build-up wirings 8A, 8B and 8C made of conductive metal are stacked. A first upper interlayer insulating film 11, a second upper interlayer insulating film 14, a third upper interlayer insulating film 18 and a solder mask 19 are sequentially deposited in the thickness direction of the first core board 1a so as to fill the regions around the upper build-up wirings 8A, 8B and 8C. To the uppermost stages of the upper build-up wirings 8A, 8B and 8C, semiconductor modules 50 and 60 are connected. Meanwhile, on a lower surface of the first core 1a, lower core board wirings 20a, 20b . . . , and 20g are arranged. Under the lower core board wirings 20a, 20b . . . , and 20g, lower build-up wirings 9A, 9B, 9C and 9D are stacked. A first lower interlayer insulating film 21, a second lower interlayer insulating film 24, a third lower interlayer insulating film 28 and a solder mask 29 are sequentially deposited in the thickness direction of the second core board 1b so as to fill the regions around the lower build-up wirings 9A, 9B, 9C and 9D. To the lower build-up wirings 9A, 9B, 9C and 9D, semiconductor modules 70 and 80 are connected.

"Core composite layer" 6 indicates a layer composed of the core board that is the hard base material and optical wiring having the optical transmission portion (core) having a high refractive index. Note that, though the optical wiring has an optical insulating portion (the cladding) having a refractive index lower than the optical transmission portion as well as the optical transmission portion, it is possible to omit the optical insulating portion when the core board is usable as the cladding.

The first and second core boards 1a and 1b imply boards arranged as a "core" in the center of the build-up wiring boards and the like in which the insulating layers and the wiring layers are sequentially stacked on both surfaces (for example, refer to "*Birudoappu taso purinto haisenban gijutsu* (Build-up multilayer printed wiring board technology), pp. 67-83, The Nikkan Kogyo Shimbun, Ltd., 2000"). First and second "core boards" 1a, 1b include base materials in each of which electric parts such as an IC and a resistor are to be incorporated onto a surface having wiring formed of copper foil and the like thereon, and indicate a common board present in a center portion of a build-up wiring board. An "optical transmission portion" 102 (2A, 2B, 2C is a region formed of a material having a refractive index higher than a periphery (cladding) thereof, and indicates a region where light is transmitted by total reflection on a boundary with the cladding.

Upper and lower "core board wirings" 10a, 10b, 10c, 10d, 10e, 20a, 20b . . . , and 20g indicate wirings directly connected to the surfaces of the core boards. Meanwhile, each of upper and lower "build-up wirings" 8A, 8B, 8C, 9A, 9B, 9C and 9D indicates a group of wirings stacked as plural layers on the "core board wiring."

In the semiconductor device shown in FIG. 2, a glass epoxy board with a thickness of 0.39 mm, which is formed by weaving glass fiber into epoxy resin, is employed as each of the first and second core boards 1a and 1b. The material of the first and second core boards 1a and 1b is not particularly limited as long as the material is set so that the coefficient of thermal expansion thereof is smaller than that of the epoxy resin, by containing the glass fiber in the epoxy resin. Moreover, besides the glass epoxy resin board, silicon board, polyimide resin board, phenol resin board, ceramic board, and silicon carbide board etc. are also usable. As shown in FIG. 1, these first and second core boards 1a and 1b include through holes 7a, 7b . . . , 7f . . . , and 7r are arranged so as to avoid the regions where the optical wirings 2A, 2B and 2C are arranged.

FIG. 2 corresponds to a cross section viewed from the II-II direction of FIG. 1. Although only the optical wiring 2A appears in the cross-sectional view of FIG. 2, the optical wirings 2A, 2B and 2C form a wiring pattern extended in the form of belts in a left-and-right direction of a page space as shown in FIG. 1. Note that the shape of the optical wirings 2A, 2B and 2C is not limited to topology as shown in FIG. 1, and bent portions may be provided therein according to needs. In addition, each of the optical wirings 2A, 2B and 2C may be formed as a multilayer. In each of the optical wirings 2A, 2B and 2C, an optical transmission portion (a core portion) 102 is formed in a cylindrical column shape with a diameter of approximately 50 µm or in a square column (a ridge) shape with a width of approximately 50 µm in an optical insulating portion (cladding portion) 103. The optical transmission portions 102 constituting the optical wirings 2A, 2B and 2C are formed at a pitch of approximately 150 µm. Each optical insulating portion 103 and each optical transmission portion 102 are made of $SiO_2$ films, and are separated based on a difference in refractive index of light therebetween, which results from a difference between the concentrations of impurities contained in the respective $SiO_2$ films. The concentrations of impurities are adjusted so that the refractive index of the optical transmission portion 102 can be made larger than that of the optical insulating portion 103. One of the optical insulating portions 103 may be formed as a region common to the optical wirings 2A, 2B and 2C, or the optical insulating portions 103 may be formed as regions independent of one another. Light incident onto each optical wiring is made to be totally reflected on the boundary between the optical transmission portion 102 and the optical insulating portion 103 and then to be transmitted through the optical transmission portion 102. Note that the optical transmission portion 102 of each of the optical wirings 2A, 2B and 2C is optically connected to another unillustrated optical transmission portion 102 through a contact hole (not shown) in which a mirror 5 is formed as needed. The material composition of the contact hole is the same as that of the optical transmission portion 102.

The optical semiconductor module 4 is a BGA type package in which a surface-emitting laser element array 42 and a light-receiving element array 43 for inputting/outputting high speed signals are mounted on a lower surface of a module board 41 on which an LSI device is mounted. This optical semiconductor module 4 is arranged above electrodes 100a, 100b, 100c and 100d arranged on the upper surface of the second core board 1b with solder balls 48a, 48b, 48c and 48d interposed therebetween. On an upper surface of the module board 41, semiconductor chips such as a transmission signal control LSI 44, a receiving signal control LSI 45 and a control LSI 46, which are for controlling the LSI device are mounted. The module board 41 is made of the same material as that of the fist and second core boards 1a and 1b, and for example, a glass epoxy board may be suitable. Note that the material of the module board 41 is not particularly limited as long as the material has the coefficient of thermal expansion close to that of the first and second core boards 1a and 1b. As the vertical cavity surface emitting laser (VCSEL) element array 42 for example, suitable is one having a structure in which an active layer (an active region) made of non-doped gallium arsenide (GaAs) is sandwiched between two cladding layers made of n-type gallium aluminum arsenide (GaAlAs) and p-type GaAlAs, reflecting mirrors or the like composed of multilayer films are provided on an outer surface of the n-type GaAlAs and an outer surface of the p-type GaAlAs, and a laser oscillation is generated between the two reflecting mirrors, thus a laser beam is emitted in the stacked direction of the cladding layers and active layer. As the light-receiving element array 43, for example, one in which a pin photodiode serving as a light-receiving portion is arranged on an indium-phosphide (n-InP) substrate may be suitable. The light-receiving portion of the light-receiving element array 43 is composed of a mesa portion and a peripheral portion. These portions form a stacked structure, in order from the substrate side an n-InP buffer layer with a thickness of 1.5 µm and an impurity concentration of $10^{15}$ cm$^{-3}$, an n-Ga$_{0.47}$In$_{0.53}$ as an optical absorption layer with a thickness of 1.9 µm and an impurity concentration of $10^{15}$ cm$^{-3}$, and an InP layer with a thickness of 1.0 µm and an impurity concentration (p) of $10^{16}$ cm$^{-3}$. The material composition of the solder balls 48a, 48b, 48c and 48d is not particularly limited. However basically, metal selected from lead (Pb), tin (Sn), silver (Ag), antimony (Sb), indium (In) and bismuth (Bi), or an alloy mainly containing the metal, is agreeable. In the example shown in FIG. 2, the solder balls 48a, 48b, 48c and 48d with a diameter of 150 µm, which use tin-lead solder (Sn/Pb=63/37), are formed.

The upper core board wirings 10a, 10b, 10c, 10d and 10e are wiring patterns formed of, for example, copper or the like. The upper build-up wiring 8A includes a via 12a connected to the upper core board wiring 10a, a via 12b connected to the upper core board wiring 10b, first upper wiring 13a connected to the via 12a and the via 12b, second upper wiring 16a connected to the first upper wiring 13a with the via 15a interposed therebetween, and second upper wiring 16b connected to the first upper wiring 13a with the via 15b interposed therebetween. The upper build-up wiring 8B includes a via 12c connected to the upper core board wiring 10c, a first upper wiring 13b connected to the via 12c, and a second upper wiring 16c connected to the first upper wiring 13b with a via 15c interposed therebetween. The upper build-up wiring 8C includes a via 12d connected to upper core board wiring 1d, a first upper wiring 13c connected to the via 12d, and a second upper wiring 16d connected to the first upper wiring 13c with a via 15d interposed therebetween.

Each of the first upper interlayer insulating film 11, the second upper interlayer insulating film 14, the third upper interlayer insulating film 18 and the solder mask 19, which are sequentially deposited on the regions around the upper build-up wirings 8A, 8B and 8C, is composed of a photosensitive epoxy resin film, a $SiO_2$ film, a PSG film, a BPSG film, a $Si_3N_4$ film, a polyimide film or the like. In the solder mask 19, openings 17a, 17b, 17c and 17d into which electrodes are to be arranged are provided. In the openings 17a and 17b, the second upper wirings 16a and 16b becoming the uppermost stage of the upper build-up wiring 8A are exposed. To these second upper wirings 16a and 16b, the semiconductor module 50 is connected with the solder balls 58a and 58b interposed therebetween. In the openings 17c and 17d, the second upper wirings 16c and 16d becoming the uppermost stages of the upper build-up wirings 8B and 8C are exposed. To these second upper wirings 16c and 16d, the semiconductor module 60 is connected with the solder balls 68a and 68b interposed therebetween. Specific configurations of the semiconductor modules 50 and 60 are not particularly limited.

The lower core board wirings 20a, 20b . . . , and 20g are wiring patterns formed of, for example, copper or the like. The lower build-up wiring 9A includes a first lower wiring 23a connected to the lower core board wiring 20b with a via 22a interposed therebetween, and a second lower wiring 26a connected to the first lower wiring 23a with a via 25a interposed there between. The lower build-up wiring 9B includes a first lower wiring 23b connected to the lower core board wiring 20d with a via 22b interposed therebetween, and a second lower wiring 26b connected to the first lower wiring 23b with a via 25b interposed therebetween. The lower build-up wiring 9C includes a first lower wiring 23c connected to the lower core board wiring 20e with a via invisible in FIG. 2 interposed therebetween, and a second lower wiring 26c connected to the first lower wiring 23c with a via 25c interposed therebetween. The lower build-up wiring 9D includes a first lower wiring 23d connected to the lower core board wiring 20f with a via 22c interposed therebetween, and a second lower wiring 26d connected to the first lower wiring 23d with a via 25d interposed therebetween. Note that, though not shown in FIG. 2, also on the lower board wiring 20a, 20c, 20e and 20g, lower build-up wirings are formed with unillustrated vias interposed therebetween.

Each of the first lower interlayer insulating film 21, the second lower interlayer insulating film 24, the third lower interlayer insulating film 28 and the solder mask 29, which are sequentially deposited on the regions around the lower build-up wirings 9A, 9B, 9C and 9D, is made of an epoxy resin film, a $SiO_2$ film, a PSG film, a BPSG film, a $Si_3N_4$ film, a polyimide film or the like. In the solder mask 29, openings 27a, 27b, 27c and 27d into which electrodes are to be arranged are provided. In the openings 27a and 27b, the second lower wirings 26a and 26b becoming the uppermost stages of the lower build-up wirings 9A and 9B are exposed. To these second lower wirings 26a and 26b, the semiconductor module 70 is connected with solder balls 78a and 78b interposed therebetween. In the openings 27c and 27d, the second lower wirings 26c and 26d becoming the uppermost stages of the lower build-up wirings 9C and 9D are exposed. To these second lower wirings 26c and 26d, the semiconductor module 80 is connected with solder balls 88a and 88b interposed therebetween. Configurations of the semiconductor modules 70 and 80 are not particularly limited.

According to the semiconductor device shown in FIGS. 1 and 2, the optical wirings 2A, 2B and 2C serving as the optical waveguides are arranged between the first core board 1a and the second core board 1b. Accordingly, the optical wirings 2A, 2B and 2C are less prone to be affected by deformation due to the thermal expansion of the interlayer insulating films and solder masks (the first upper interlayer insulating film 11, the second upper interlayer insulating film 14, the solder mask 9, the third upper interlayer insulating film 18, the first lower interlayer insulating film 21, the second lower interlayer insulating film 24, the third lower interlayer insulating film 28, and the solder mask 29), which are deposited on both surfaces of the core composite layer 6. Therefore, as compared with the earlier technology of forming the optical waveguides between or above the interlayer insulating films and the solder masks 11, 14, 18, 19, 21, 24, 28 and 29, the optical wirings 2A, 2B and 2C can be arranged flatly and evenly. As a result, highly precise optical alignment of the optical wirings 2A, 2B and 2C with the optical semiconductor module 4 can be realized, and connection reliability of the wirings is also enhanced. Moreover, the optical wirings 2A, 2B and 2C can be freely arranged on the surfaces of the core boards 1a and 1b, and accordingly, are not restricted to a layout of electric signal wiring as compared with the case where the optical waveguides are arranged on the interlayer insulating films. Therefore, a semiconductor device capable of high-density packaging can be offered. Furthermore, the optical semiconductor module 4 including the module board 41 made of the same material as that of the first and second core boards 1a and 1b is directly arranged on the first and second core boards 1a and 1b. Accordingly, destruction of the solder balls 48a, 48b, 48c and 48d, which is caused by a difference in the coefficient of thermal expansion between the first and second core boards 1a and 1b and the module board 41, can be easily prevented. Meanwhile, the semiconductor modules 50, 60, 70 and 80 which do not perform an optical connection are connected to the first and second core boards 1a and 1b while interposing therebetween the upper build-up wirings 8A, 8B, 8C and the lower build-up wirings 9A, 9B, 9C and 9D, in which it is easy to miniaturize the wiring. Accordingly, high-density packaging can be realized.

A packaging density of the semiconductor device according to the first embodiment was evaluated. In a semiconductor device having a configuration of an electro-optical wiring board, which was similar to that of the first embodiment of the present invention, a board dimension in the case where the optical waveguides were formed on the solder mask 19 was 144 mm×144 mm. On the contrary, a dimension of an electro-optical wiring board constituting the semiconductor device shown in FIG. 2 was 96 mm×96 mm, and miniaturization thereof could be realized. In other words, according to the semiconductor device in accordance with the first embodiment of the present invention, a semiconductor device having a packaging density of approximately 1.5 times that of the earlier technique semiconductor device could be realized. From this result, it was verified that the layer of the optical transmission portions 102 could be arranged on the surfaces of the core boards, which did not affect the packaging density of the board wirings, and thus the high-density packaging was made possible, while the earlier technique semiconductor device could not achieve the improvement of the packaging density because a wiring layout of the layer of the optical transmission portions 102 constituting the optical waveguides became a rate determining factor.

Moreover, optical coupling efficiency between the optical semiconductor module 4 and a light inputting/outputting portion of the optical wiring 2A in the semiconductor device according to the first embodiment was evaluated. Optical coupling loss in the light inputting/outputting portion in the case where the optical waveguides were formed on the solder mask 19 was approximately 1.0 dB. As compared with this result, an optical coupling loss in the light inputting/outputting portion of the semiconductor device according to the first embodiment was approximately 0.2 dB, and it was verified that the optical coupling loss could be lowered in the semiconductor device shown in FIG. 1. Furthermore, the reliability of the semiconductor device shown in FIG. 2 was evaluated. A reliability evaluation test was performed for a total of 128 solder balls 48a, 48b, 48c and 48d mounted on the optical semiconductor module 4. Here, the case where the connection was made open even in one spot was evaluated as a "failure." The number of samples was set at 1000, and the test was performed under a temperature cycle condition of (−55°

C. (30 min.) to 25° C. (5 min.) to 125° C. (30 min.) to 25° C. (5 min.)). When the optical waveguides were formed on the solder mask 19, the connection failure occurred in 1000 cycles, and in 2000 cycles, the connection failures occurred in all of the samples. From this result, it was verified that the reliability of the optical semiconductor module 4 on the packaging and the connection was extremely enhanced according to the semiconductor device shown in FIG. 2.

Next, a manufacturing method of the semiconductor device according to the first embodiment of the present invention is described with reference to FIGS. 3 to 13. While FIG. 5 is a cross-sectional view taken on line V-V in FIG. 1, FIGS. 3, 4, and 6 to 13 are cross-sectional views taken on line II-II in FIG. 1. The manufacturing method of a semiconductor device, which is described below, is a mere example. It is a matter of course that the semiconductor device according to the first embodiment can be manufactured by other various manufacturing methods including modification examples of the manufacturing method to be described below.

(A) The first core board 1a composed of a glass epoxy board or the like is prepared. The optical wirings 2A, 2B and 2C serving as the optical waveguides are formed. Although only the optical wiring 2A appears in the cross-sectional view shown in FIG. 3, the other optical wirings 2B and 2C are present behind the optical wiring 2A in the cross section. Each of the optical wirings 2A, 2B and 2C is a sheet fabricated in a manner that a $SiO_2$ film which serves as the optical transmission portion and has a thickness of several ten micrometers is deposited on a glass substrate made of quartz, impurities are selectively added to a region serving as the optical transmission portion, and the $SiO_2$ film is then exfoliated from the glass substrate. Then, these optical wirings 2A, 2B and 2C are arranged on the upper surface of the first core board 1a as shown in FIG. 3. Subsequently, the mirror 5 was formed on a spot of each of the optical wirings 2A, 2B and 2C, which requires the mirror 5, by etching or the like. At this event, a part of the $SiO_2$ film can be etched by the earlier technique of etching with a solution containing hydrofluoric acid as a major component to form through-holes to be described later. Thereafter, as shown in FIG. 4, the optical wirings 2A, 2B and 2C and the mirrors 5 are sandwiched between the first core board 1a and the second core board 1b, and the obtained structure is adhered together by pre-impregnation. Copper foils 10 and 20 are bonded on the upper surface of the second core board 1b and the lower surface of the first core board 1a, respectively, and the copper foils are thinned by etching. The glass epoxy boards serving as the core boards are not particularly limited as long as the boards are formed so that the thermal expansion coefficients thereof are made smaller than that of the epoxy resin, by weaving the glass fiber into the epoxy resin.

(B) As shown in FIG. 5, the through holes 7a, 7b ..., and 7f are drilled in spots of the core board 1, which require the through holes, and insides of the through holes 7a, 7b ..., and 7f are plated by an electroless plating method, an electroplating method or the like. In the example shown in FIG. 5, the plating was performed after forming the through holes 7a, 7b ..., and 7f with a diameter of 250 „m, and the copper foils 10 and 20 with a thickness of 22 μm were formed. Subsequently, unillustrated photoresist films are coated on the upper and lower surfaces of the core board 1 on which the copper foils 10 and 20 are formed, and the photoresist films are patterned by using a photolithography technology. While using the patterned photoresist films as etching masks, the upper core board wirings 10a, 10b ..., and 10e and the electrodes 100a, 100b, 100c and 100d, which are as shown in FIG. 6, are formed by using iron(III) chloride and the like on the second core board 1b. In a similar way, on the first core board 1a, the lower core board wirings 20a, 20b ..., and 20g are formed. The wiring patterns of the upper core wiring boards 10a, 10b ..., and 10e, electrodes 100a, 100b, 100c and 100d and lower core board wirings 20a ..., and 20g are not particularly limited. However, in the example shown in FIG. 6, the line width of the lines and spaces is designed to be 100 μm, the space width thereof is designed to be 100 μm, and the diameter of the through hole lands is designed to be 550 μm.

(C) As shown in FIG. 7, the first upper interlayer insulating film 11 made of the photosensitive epoxy resin or the like is deposited entirely on the upper surfaces of the upper core board wirings 10a, 10b ..., and 10e and electrodes 100a, 100b, 100c and 100d. The first lower interlayer insulating film 21 made of the photosensitive epoxy resin or the like is deposited entirely on the upper surfaces of the lower core board wirings 20a, 20b ..., and 20g. Subsequently, as shown in FIG. 8, after the first upper interlayer insulating film 11 and the first lower interlayer insulating film 21 are exposed and developed, metal filling is performed, and thus the vias 12a, 12b, 12c, 12d, 22a, 22b and 22c are formed selectively. Moreover, the metal layers made of copper or the like are deposited on the obtained structure, and are then etched. Thus, the first upper wirings 13a, 13b and 13c and the first lower wirings 22a, 22b, 22c and 22d are formed. In the example shown in FIG. 8, for the wiring patterns of the first upper wirings 13a, 13b and 13c and first lower wirings 22a, 22b, 22c and 22d, thickness was set at 18 μm, the line width of the lines and spaces is set at 75 μm, and the space width thereof was set at 75 μm.

Figure 9:
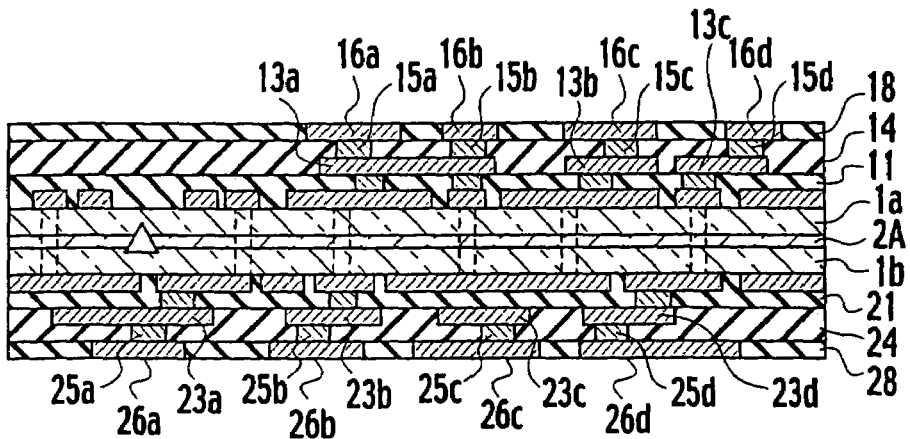

(D) As shown in FIG. 9, the second upper interlayer insulating film 14 made of the photosensitive epoxy resin or the like is deposited entirely on the upper surfaces of the first upper wirings 13a, 13b and 13c and first upper interlayer insulating film 11. Then, after the second upper interlayer insulating film 14 is exposed and developed, the metal filling is performed, and thus the vias 15a, 15b, 15c and 15d are formed selectively. Subsequently, the second upper wirings 16a, 16b, 16c and 16d are formed on the upper surfaces of the vias 15a, 15b, 15c and 15d, and the third upper interlayer insulating film 18 is deposited in the peripheries of the second upper wirings 16a, 16b, 16c and 16d. On the first lower interlayer insulating film 21 and the first lower wirings 23a, 23b and 23c, the second lower interlayer insulating film 24 made of the photosensitive epoxy resin or the like is deposited. Then, after the second lower interlayer insulating film 24 is exposed and developed, the metal filling is performed, and thus the vias 25a, 25b, 25c and 25d are formed. Subsequently, the second lower wirings 26a, 26b, 26c and 26d are formed on the vias 25a, 25b, 25c and 25d by the photolithography technology and the like, and the third lower interlayer insulating film 28 is deposited in the periphery of the second lower wirings 26a, 26b, 26c and 26d. Note that, in the example shown in FIG. 9 for lines and spaces of the second upper wirings 16a, 16b, 16c and 16d and second lower wirings 26a, 26b, 26c and 26d, a line width is set at 50 μm and a space width is set at 50 „m in consideration of a pitch of external I/O terminals of the semiconductor modules 50 and 60 mounted on the uppermost stage.

Figure 10:
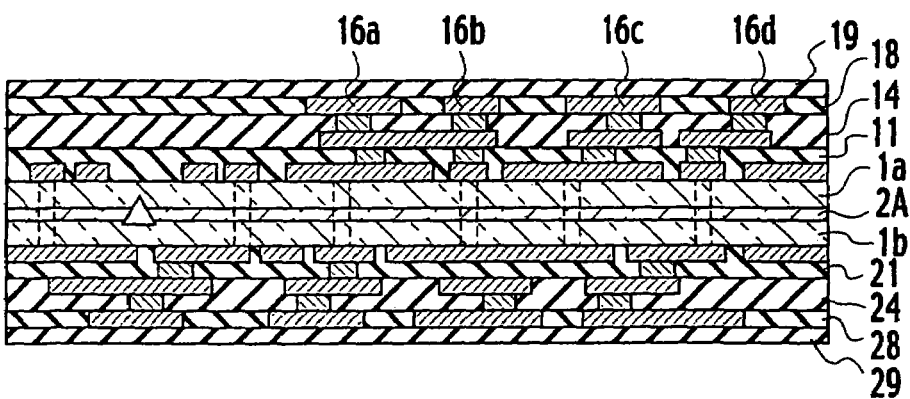
Figure 11:
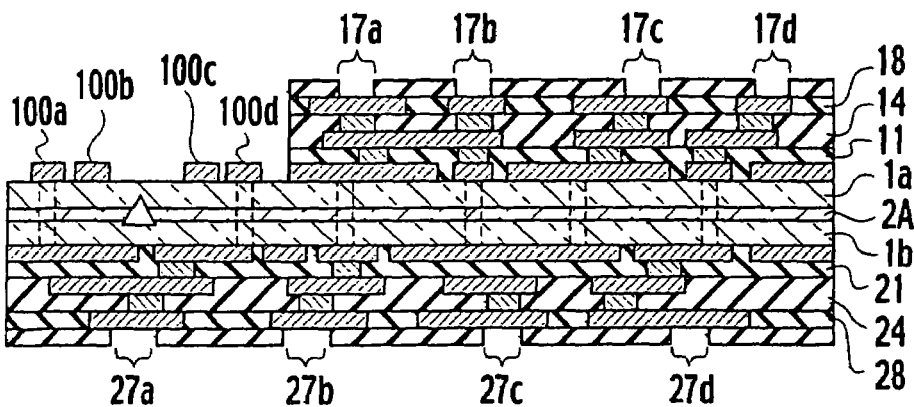

(E) As shown in FIG. 10, the solder masks 19 and 29, each of which is composed of the $SiO_2$ film, the PSG film, the BPSG film, the $Si_3N_4$ film, the polyimide film or the like, are deposited on the third upper interlayer insulating film 18 and the third lower interlayer insulating film 28. Subsequently, on the solder masks 19 and 29, the photoresist films (not shown) are coated, and are then patterned by using photolithography technology. While using the patterned photoresist films as etching masks the solder masks 19 and 29 are etched. As a result of this, as shown in FIG. 11, the plurality of openings 17a, 17b, 17c and 17d are formed in the solder mask 19. In the solder mask 29, the plurality of openings 27a, 27b, 27c and 27d are formed. In this case, the electrodes 100a, 100b, 100c and 100d for directly mounting the optical semiconductor module 4 on the core board 1 are also exposed. Note that, in FIG. 11, the width of the openings 17a, 17b, 17c, 17d, 27a, 27b, 27c and 27d is set at 120 μm. Moreover, in this case, portions of the glass epoxy board becoming the core board, which are located above the mirrors 5, are made open by etching.

Figure 12:
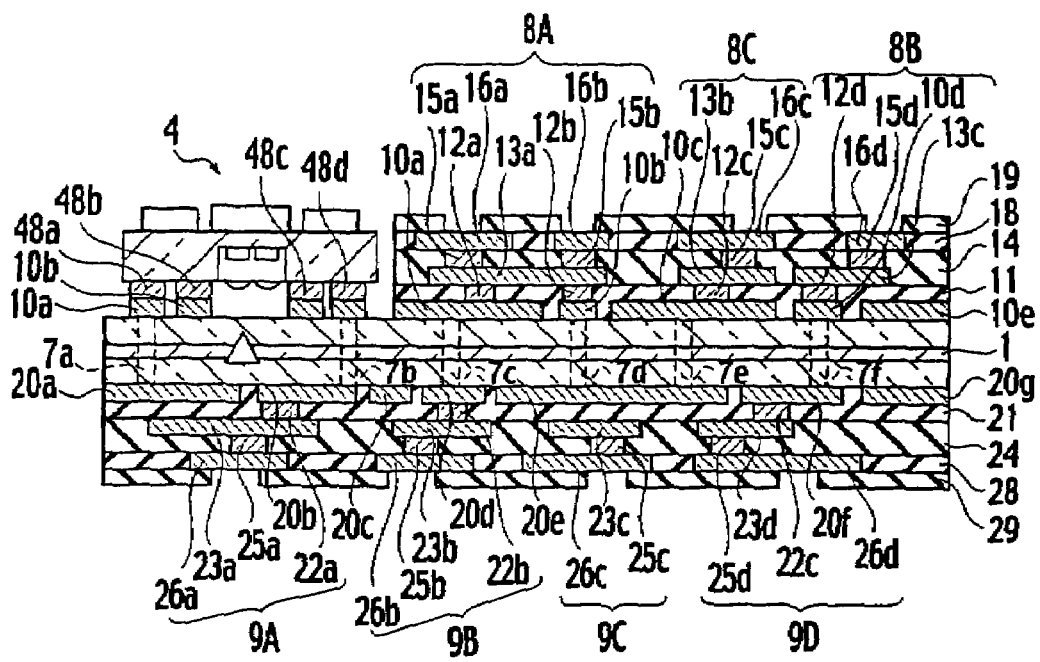
Figure 13:
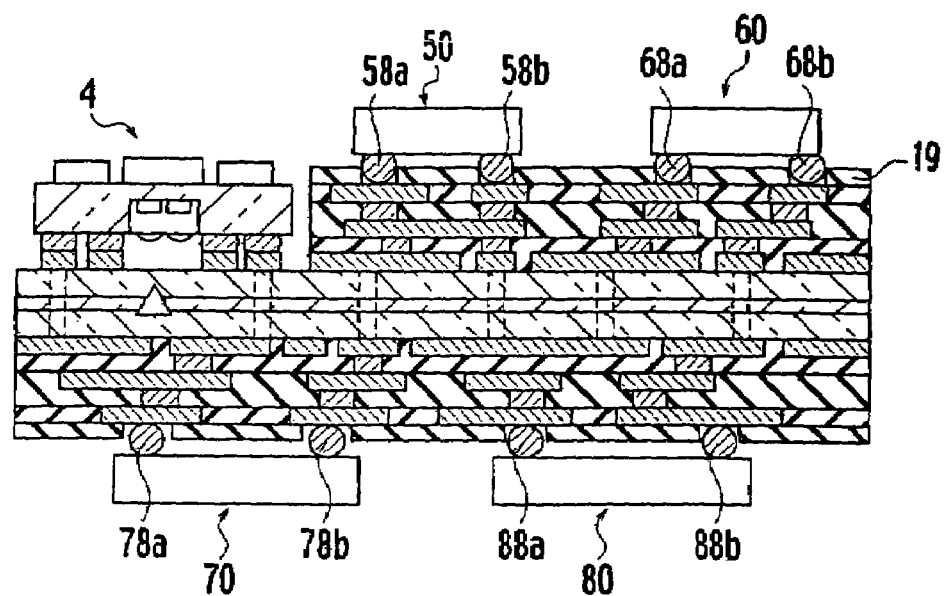

(F) As shown in FIG. 12, the solder balls 48a, 48b, 48c and 48d of the optical semiconductor module 4 are opposed to the electrodes 100a, 100b, 100c and 100d, respectively, and are aligned by a half tone. Then, the optical semiconductor module 4 is mounted on the second core board 1b. Note that, though not illustrated, the optical semiconductor module 4 and the core board 1 are preheated in a nitrogen atmosphere at approximately 350° C., and the optical semiconductor module 4 is aligned while being held by a collet or the like having a heating mechanism. Next, the solder balls 48a, 48b, 48c and 48d and the electrodes 100a, 100b, 100c and 100d are brought into contact with each other, and are applied with pressure of approximately 30 kg/mm². Then, the ambient temperature is raised to approximately 370° C, and thus the solder balls 48a, 48b, 48c and 48d are molten. As a result of this, the second core board 1b and the optical semiconductor module 4 are connected to each other. Subsequently, as shown in FIG. 13, the semiconductor module 50 is mounted on the second upper wirings 16a and 16b exposed from the opening 17a and 17b with the solder balls 58a and 58b interposed therebetween. It is possible to place underfill resin around the solder balls 58a and 58b. The semiconductor module 60 is mounted on the second upper wirings 16c and 16d exposed by the openings 17c and 17d with the solder balls 68a and 68b interposed therebetween. It is also possible to place underfill resin around the solder balls 68a and 68b. On the second lower wirings 26a and 26b exposed by the openings 27a and 27b, the semiconductor module 70 is mounted with the solder balls 78a and 78b interposed therebetween. On the second lower wirings 26c and 26d exposed by the openings 27c and 27d, the semiconductor module 80 is mounted with the solder balls 88a and 88b interposed therebetween. It is also possible to place underfill resin around the solder balls 78a, 78b, 88a and 88b. By the processes described above, the semiconductor device according to the first embodiment is completed.

First Modification of the First Embodiment

Figure 14:
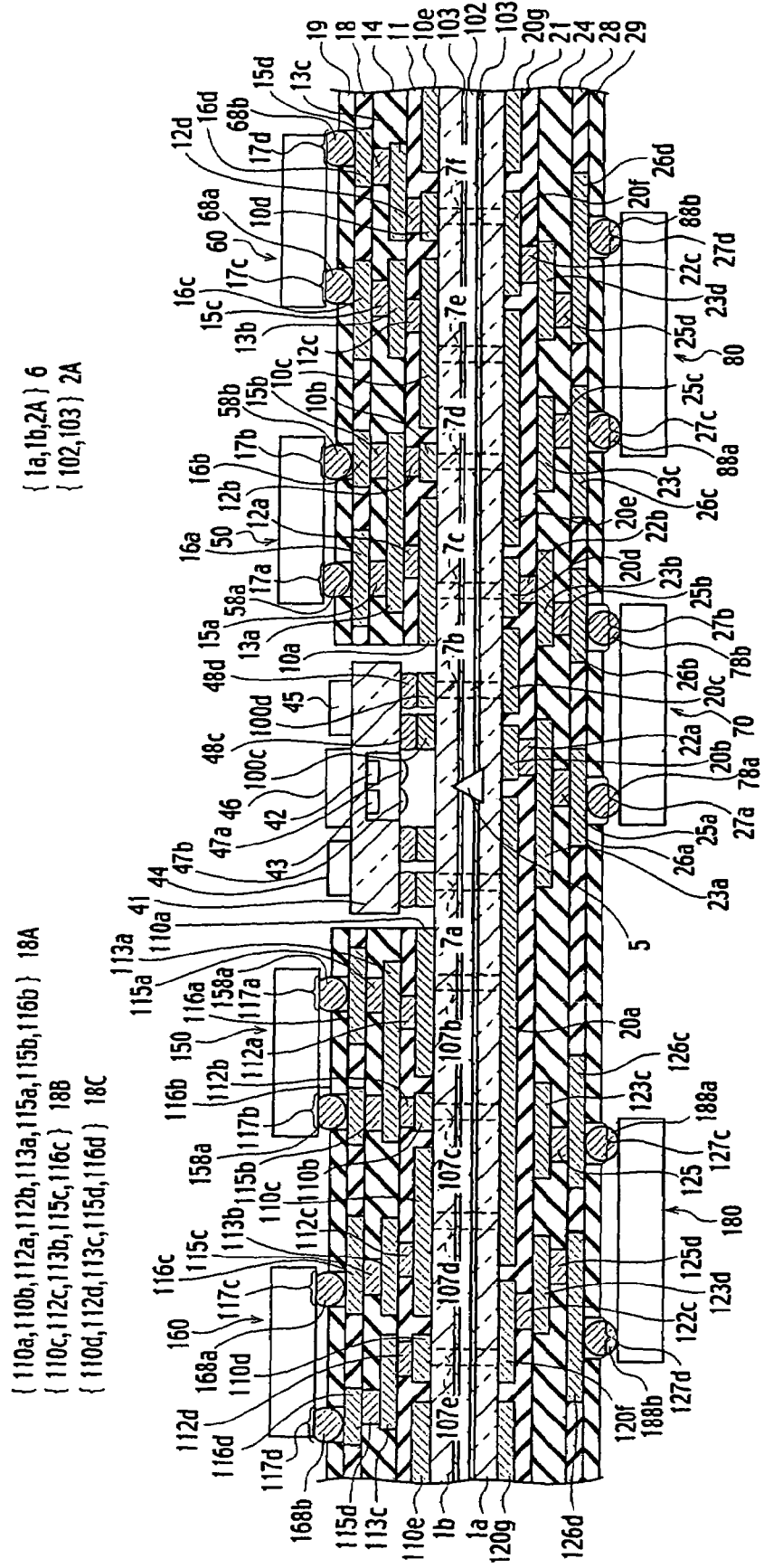
FIG. 14 is a cross-sectional view showing an example of the semiconductor device according to the first modification of the first embodiment.

As shown in FIG. 14, a semiconductor device according to a first modification of the first embodiment includes a semiconductor module 4 disposed on the center area of the upper surface of the second core board 1b. The right side area of the semiconductor module 4 of the semiconductor device in FIG. 14, is substantially the same as shown in FIG. 2, detailed explanation is omitted.

On the left side space to the paper in FIG. 14, the upper core board wirings 110a, 110b, 110d and 110e are arranged on the upper surface of the second core board 1b. On the upper core board wirings 110a, 110b and 110d, upper build-up wirings 18A, 18B and 18C made of conductive metal are stacked. The first upper interlayer insulating film 11, the second upper interlayer insulating film 14, the third upper interlayer insulating film 18 and a solder mask 19 are sequentially deposited in the thickness direction of the first core board 1a so as to fill the regions around the upper build-up wirings 18A, 18B and 18C. To the uppermost layer of the upper build-up wirings 18A, 18B and 18C, semiconductor modules 150 and 160 are connected.

On the left side space to the paper in FIG. 14, lower core board wirings 120f and 120g are arranged on the lower surface of the first core 1a. Under the lower core board wirings 120a, 120f, and 120g, lower build-up wirings 19C and 19D are stacked. The first lower interlayer insulating film 21, the second lower interlayer insulating film 24, the third lower interlayer insulating film 28 and a solder mask 29 are sequentially deposited in a thickness direction of the first core board 1a so as to fill regions around the lower build-up wirings 19C and 19D. To the lower build-up wirings 19C and 19D, semiconductor modules 180 is connected. The first and second core boards have a through hole 107b, 107c, 107d, and 107e arranged so as to avoid the regions where the optical wirings 2A, 2B and 2C are arranged.

The upper core board wirings 110a, 110b, 110c, 110d and 110e are wiring patterns formed of, for example, copper or the like. The upper build-up wiring 18A includes a via 112a connected to the upper core board wiring 110a, a via 112b connected to the upper core board wiring 110b, a first upper wiring 113a connected to the via 112a and the via 112b, a second upper wiring 116a connected to the first upper wiring 113a with the via 115a interposed therebetween, and a second upper wiring 116b connected to the first upper wiring 113a with the via 115b interposed therebetween. The upper build-up wiring 18B includes a via 112c connected to the upper core board wiring 110c, a first upper wiring 113b connected to the via 112c, and a second upper wiring 116c connected to the first upper wiring 113b with a via 115c interposed therebetween. The upper build-up wiring 18C includes a via 112d connected to upper core board wiring 110d, a first upper wiring 113c connected to the via 112d, and a second upper wiring 116d connected to the first upper wiring 113c with a via 115d interposed therebetween.

Each of the first upper interlayer insulating film 11, the second upper interlayer insulating film 14, the third upper interlayer insulating film 18 and the solder mask 19, which are sequentially deposited on the regions around the upper build-up wirings 18A, 18B and 18C, is composed of a photosensitive epoxy resin film, a $SiO_2$ film, a PSG film, a BPSG film, a $Si_3N_4$ film, a polyimide film or the like. In the solder mask 19, openings 117a, 117b, 117c and 117d into which electrodes are to be arranged are provided. In the openings 117a and 117b, the second upper wirings 116a and 116b becoming the uppermost layer of the upper build-up wiring 18A are exposed. To these second upper wirings 116a and 116b, the semiconductor module 150 is connected with the solder balls 158a and 158b interposed therebetween. In the openings 117c and 117d, the second upper wirings 116c and 116d becoming the uppermost layers of the upper build-up wirings 18B and 18C are exposed. To these second upper wirings 116c and 116d, the semiconductor module 160 is connected with the solder balls 168a and 168b interposed therebetween.

The lower core board wirings 120f and 120g are wiring patterns formed of, for example, copper or the like. The lower build-up wiring 19C includes a first lower wiring 123c connected with a via not shown in FIG. 14, and a second lower wiring 126c connected to the first lower wiring 123c with a via 125c interposed therebetween. The lower build-up wiring 19D includes a first lower wiring 123d connected to the lower core board wiring 120f with a via 122c interposed therebetween, and second lower wiring 126d connected to the first lower wiring 123d with a via 125d interposed therebetween. Note that, though invisible in FIG. 14, also on the lower board wiring 20g, lower build-up wirings are formed with unillustrated vias interposed therebetween.

Each of the first lower interlayer insulating film 21, the second lower interlayer insulating film 24, the third lower interlayer insulating film 28 and the solder mask 29, which are sequentially deposited on the regions around the lower build-up wirings 19C and 19D, is made of an epoxy resin film, a $SiO_2$ film, a PSG film, a BPSG film, a $Si_3N_4$ film, a polyimide film or the like. In the solder mask 29, openings 127c and 127d into which electrodes are to be arranged are provided. In the openings 127c and 127d, the second lower wirings 126c and 126d becoming the uppermost layers of the lower build-up wirings 19C and 19D are exposed. To these second lower wirings 126c and 126d, the semiconductor module 180 is connected with solder balls 188a and 188b interposed therebetween.

Figure 15:
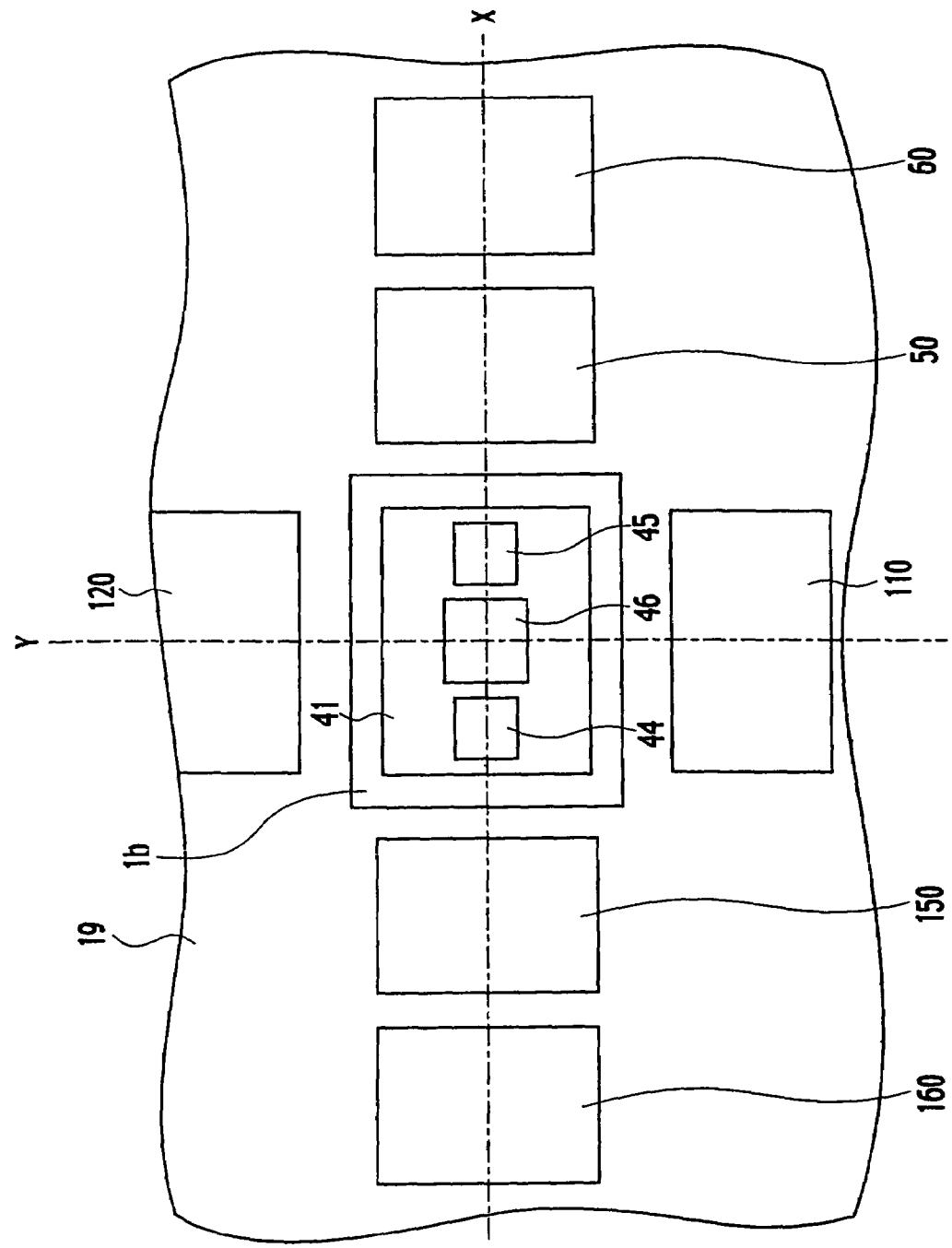
FIG. 15 is a plane view showing an example of the semiconductor device according to the first modification of the first embodiment.

FIG. 15 shows an example of a plane view viewed from above the optical semiconductor module 4 as shown in FIG. 14. The optical semiconductor module 4 is disposed at the center region of the upper surface of the second core board 1b where the center axis X and Y cross. The semiconductor modules 50 and 150 are arranged so that it becomes symmetrical at the center axis Y. The semiconductor modules 60 and 160 are arranged so that it becomes symmetrical at the center axis Y. The semiconductor module 110 and 120 are arranged so that it becomes symmetrical at the center axis X.

According to the first modification of the first embodiment, since the optical semiconductor module 4 is arranged on the center area of the upper surface of the second core board 1b (the core composite layer 6), the optical semiconductor module 4 is less prone to be affected by deformation due to the thermal expansion of the second core board 1b and stress distortion of the electrodes 100a, 100b, 100c and 100d caused by the heat expansion of the second core board 1b may be suppressed. As a result, highly precise optical alignment of the optical wirings 2A, 2B and 2C with the optical semiconductor module 4 can be realized, and connection reliability of the wirings is also enhanced. As described above, the optical semiconductor module 4 is mounted at the center area of the upper surface of the second core board 1b in FIGS. 14 and 15. However, the area to be mounted is not strictly limited to the center area. It can be also possible to mount surrounding area of the center area which is also less prone to be affected by deformation due to the thermal expansion of the second core board 1b.

Second Modification of the First Embodiment

Figure 16:
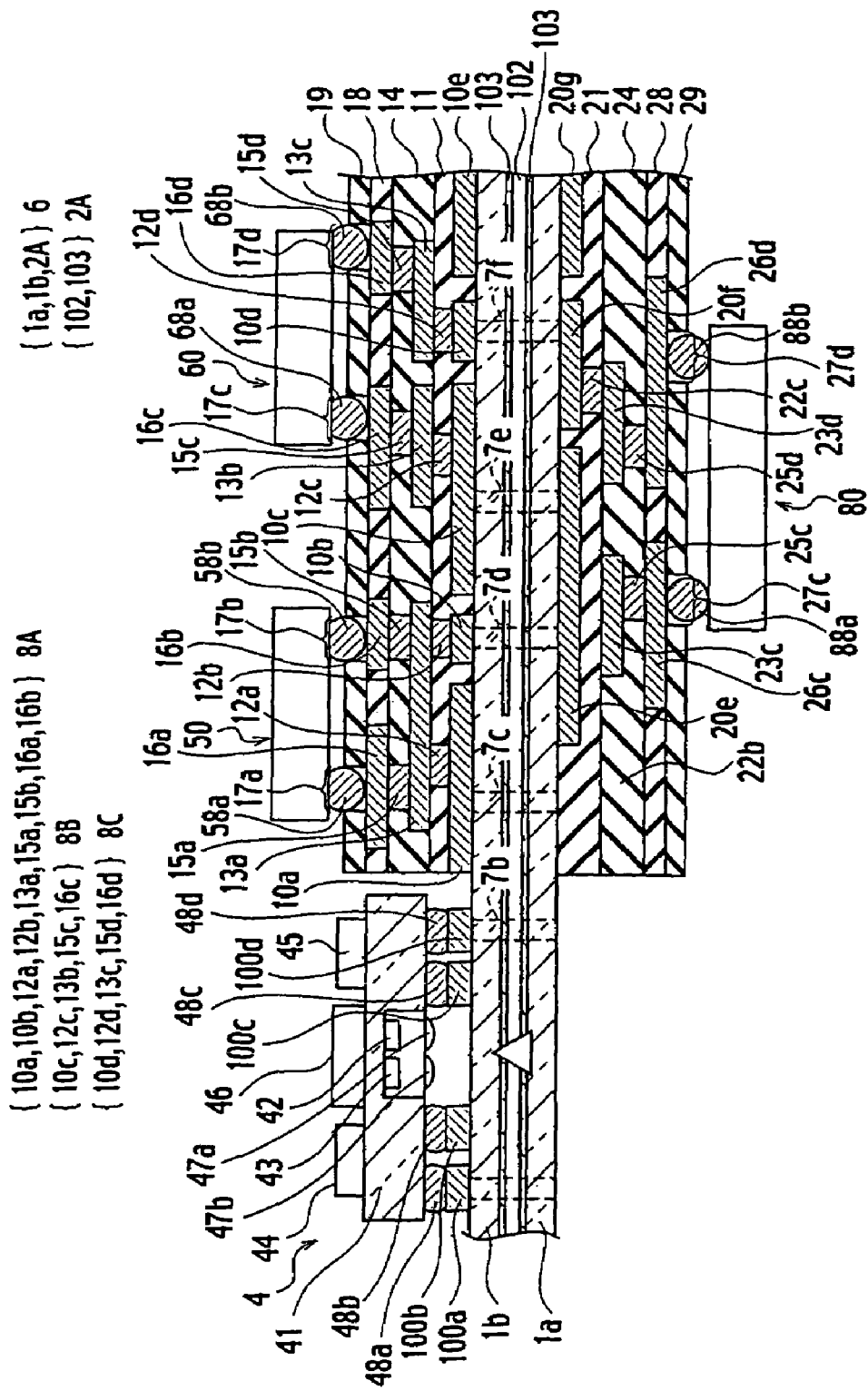
FIG. 16 is a cross-sectional view showing an example of the semiconductor device according to the second modification of the first embodiment.

As shown in FIG. 16, a semiconductor device according to a second modification of the first embodiment differs in that the lower core board wirings 20e, 20f, and 20g, the lower build-up wirings 19C and 19D, the first lower interlayer insulating film 21, second lower interlayer insulating film 24, the third lower interlayer insulating film 28, and the solder mask 29 are not disposed on the region opposing the optical semiconductor module 4 with the first and second core board 1a and 1b.

According to the semiconductor device as shown in FIG. 16, since the lower build-up wirings 19C, 19D and the like are disposed away from the region opposing the optical semiconductor module 4, warpage of the first and second core board 1a, and 1b can be suppressed due to the thermal expansion of the multilayered structures. Therefore, highly precise optical alignment of the optical wirings 2A, 2B and 2C with the optical semiconductor module 4 can be realized and the stress distortion occurs at the electrodes 100a, 100b, 100c, and 100d, which are disposed directly under the optical semiconductor module 4, caused by deformation due to the thermal expansion of the board may be suppressed. As a result, the reliability between the optical semiconductor module 4 and the first and second core boards is improved.

Second Embodiment

Figure 17:
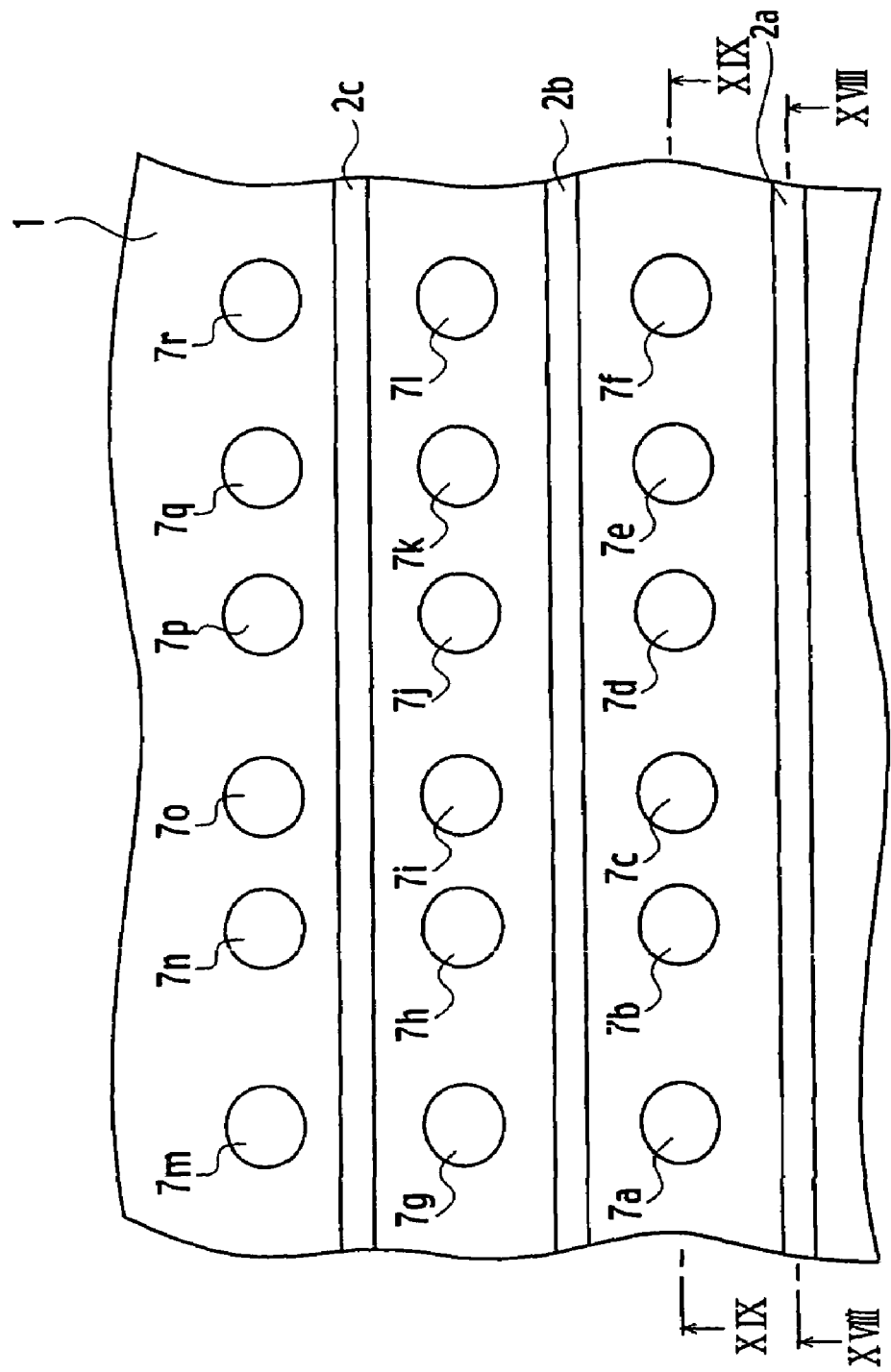
FIG. 17 is plane view showing an arrangement relationship between an upper optical wiring and a through hole of the semiconductor device according to the second embodiment of the present invention.
Figure 18:
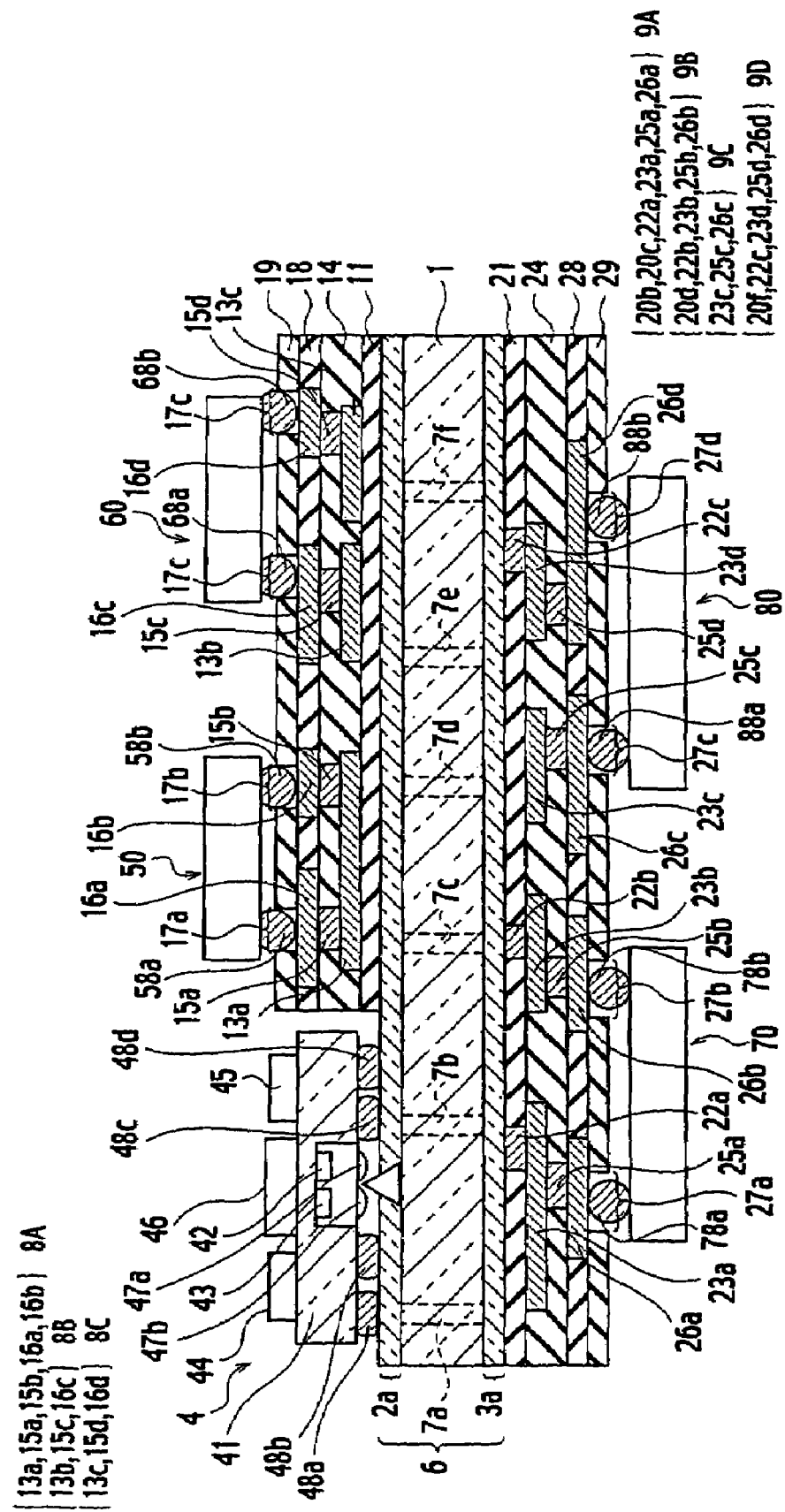
FIG. 18 is a cross-sectional view showing an example of a semiconductor device according to the second embodiment of the present invention.

As shown in FIG. 18, a semiconductor device according to a second embodiment of the present invention includes a core composite layer 6 composed of a core board 1, upper optical wirings (first optical transmission portions) 2a, 2b and 2c (for the upper optical wirings 2b and 2c, refer to FIG. 17) arranged on an upper surface of the core board 1, and lower optical wiring (a second optical transmission portion) 3a arranged on a lower surface of the core board 1. FIG. 18 corresponds to a cross-sectional view taken on line XVIII-XVIII in FIG.17. From a cross-sectional view (refer to FIG. 19) taken on line XIX-XIX in FIG. 17, upper core board wirings 10a, 10b..., and 10e are arranged on portions of the core board 1, on which the upper optical wirings 2a, 2b and 2c are not arranged.

Figure 19:
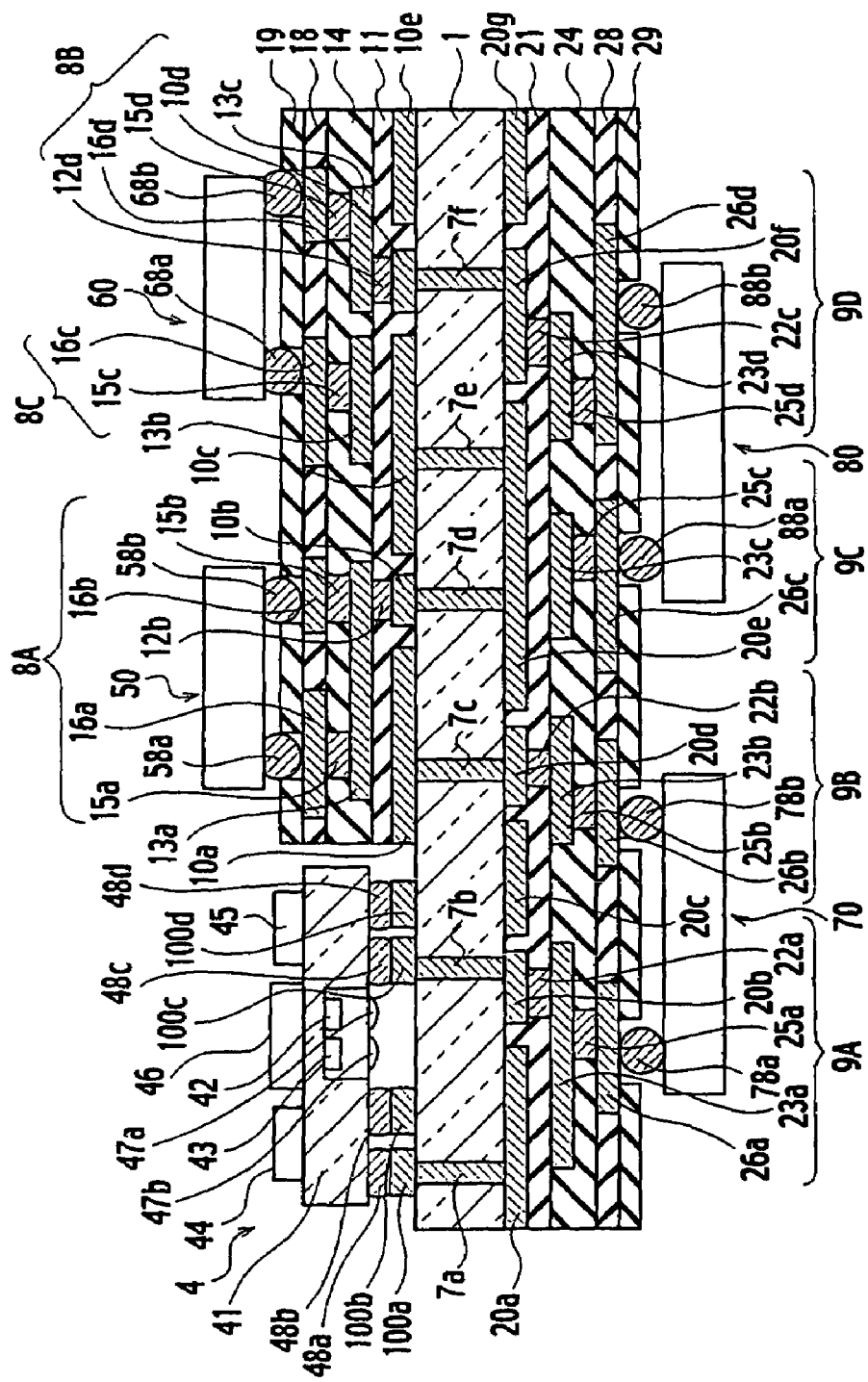
FIG. 19 is a cross-sectional view taken on line XIV-XIV in FIG. 17, showing an example of a semiconductor device according to the second embodiment of the present invention.

As shown in FIG. 19, lower core board wirings 20a, 20b..., and 20g are arranged. As shown in FIG. 17, the upper optical wirings 2a, 2b and 2c are wiring patterns extended in a left-and-right direction of a page space. Moreover, similarly to the upper optical wirings 2a, 2b and 2c, the lower optical wiring 3a is also a wiring pattern extended in the left-and-right direction of the page space.

The shape of the upper optical wirings 2a, 2b and 2c and the lower optical wiring 3a is not limited to the topology shown in FIG. 19, and bent portions may be provided according to needs. In addition, each of the upper optical wirings 2a, 2b and 2c and the lower optical wiring 3a may be formed as a multilayer in the thickness direction of the core board 1. These upper optical wirings 2a, 2b and 2c and lower optical wiring 3a are made of, for example, fluorinated polyimide or the like. Moreover, as the upper optical wirings 2a, 2b and 2c and the lower optical wiring 3a, optical fibers made of quartz or the like, and the like, can also be arranged. Other than the above, the semiconductor device shown in FIG. 18 has a similar configuration to that of the semiconductor device shown in FIGS. 1 and 2, and description thereof is omitted.

According to the semiconductor device of the second embodiment, the upper optical wirings 2a, 2b and 2c and the lower optical wiring 3a, which serve as optical waveguides, are arranged on both surfaces of the core board 1. Accordingly, the upper optical wirings 2a, 2b and 2c and the lower optical wiring 3a are less prone to be affected by deformation of interlayer insulating films 11, 14, 18, 21, 24 and 28 and solder masks 19 and 29, of which thermal expansion coefficients are large. Moreover, as compared with the case of forming the optical waveguides between or above the interlayer insulating films 11, 14, 18, 21, 24 and 28 and the solder masks 19 and 29, which are deposited on the upper surface of the core board 1, the upper optical wirings 2a, 2b and 2c and the lower optical wiring 3a can be formed flat. As a result of this, highly precise optical alignment of an optical semiconductor module 4 with the upper optical wirings 2a, 2b and 2c and the lower optical wiring 3a can be realized, and the connection reliability of the wiring is also enhanced. Moreover, the upper optical wirings 2a, 2b and 2c and the lower optical wiring 3a can be freely arranged on the surface of the core board 1 without being restricted to a wiring layout of other wirings and through holes 7a, 7b..., and 7f. Therefore, a semiconductor device which is easy to manufacture and is capable of high-density packaging can be offered. Particularly, the upper optical wirings 2a, 2b and 2c and the lower optical wiring 3a are formed on the surface of the core board 1, thus facilitating the manufacture of an electro-optical wiring board constituting the semiconductor device also in the case of stacking plural layers to form each of the upper optical wirings 2a, 2b and 2c and the lower optical wiring 3a. Moreover, the optical semiconductor module 4 including a module board 41 made of the same material as that of the core board 1 is directly arranged on the core board 1. Accordingly, destruction of solder balls 48a, 48b, 48c and 48d, which is caused by a difference in the thermal expansion coefficient between the core board 1 and the module board 41, can be easily prevented. Meanwhile, semiconductor modules 50 and 60 which do not perform an optical connection are connected to the core board 1 while interposing therebetween upper build-up wirings 8A, 8B and 8C in which it is easy to miniaturize the wiring. Accordingly, high-density packaging can be realized.

Film thickness distribution of the upper optical wirings 2a, 2b and 2c and lower optical wiring 3a of the semiconductor device shown in FIG. 6 was measured. As a result of this, the film thickness distribution was equal to or less than ±1 µm. Moreover, a transmission loss value of a single-mode optical transmission portion 102 in the core board 1 became 0.35 µm ±0.05 dB/cm in a wavelength of 1.3 µm. Meanwhile, when the optical transmission portion 102 was arranged on upper surfaces of upper build-up wirings 8A, 8B and 8C and a third upper interlayer insulating film 18, the film thickness distribution became ±10 µm, and the transmission loss value of the single-mode optical transmission portion 102 became 0.65 µm ±0.15 dB/an in the wavelength of 1.3 µm. As a result of this, it is understood that, according to the semiconductor device of the second embodiment, it is possible to form upper optical wirings 2a, 2b and 2c and lower optical wiring 3a, which are flat, even, and low in transmission loss, and to realize a semiconductor device excellent in connection reliability.

Moreover, the packaging density of the semiconductor device shown in FIG. 6 was evaluated. In a semiconductor device having a circuit configuration similar to that of the present invention, a dimension of an electro-optical board when the optical waveguides were formed on the solder mask 19 became 144 mm×144 mm. On the contrary to this, a dimension of an electro-optical wiring board constituting the semiconductor device shown in FIG. 6 was 96 mm×96 mm, and miniaturization thereof could be realized. From this result, it could be verified that, according to the semiconductor device in accordance with the second embodiment of the present invention, a semiconductor device having a packaging density of approximately 1.5 times that of the conventional semiconductor device could be realized.

Figure 20:
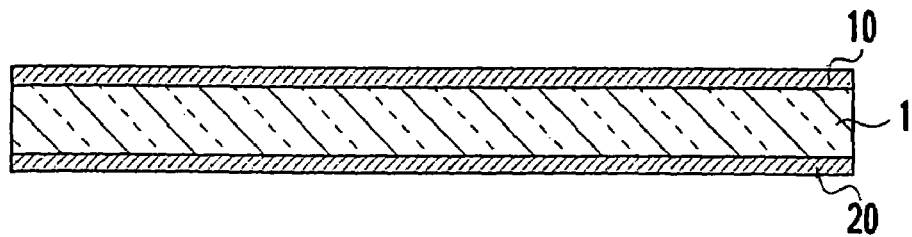
FIGS. 20-23 are cross-sectional views showing a method of manufacturing the semiconductor device according to the second embodiment of the present invention.
Figure 21:
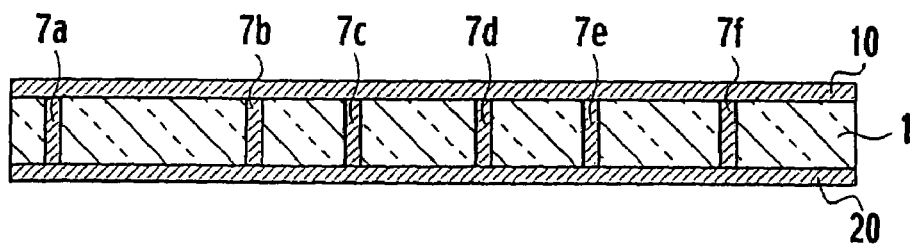
Figure 22:
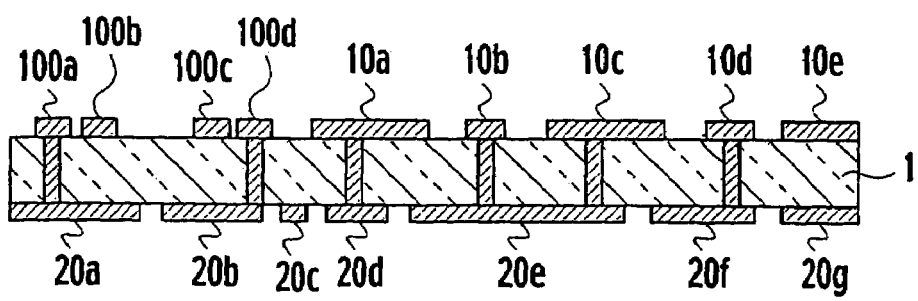

Next, a manufacturing method of the semiconductor device according to the second embodiment of the present invention is described with reference to FIG. 20. FIGS. 20 to 22 are cross-sectional views taken on line XIX-XIX of FIG. 17, and FIG. 23 is a cross-sectional view taken on line XVIII-XVIII in FIG. 17.

(A) As shown in FIG. 20, the core board 1 composed of a glass epoxy board or the like is prepared. Then, copper foils 10 and 20 are bonded to the upper and lower surfaces of the core board 1, and the copper foils 10 and 20 are thinned by etching.

(B) As shown in FIG. 21, through holes 7a, 7b . . . , and 7f are drilled in spots of the core board 1, which require the through holes, and insides of the through holes 7a, 7b . . . , and 7f are plated by an electroless plating method, an electroplating method or the like. In the example shown in FIG. 21, the plating was performed after forming the through holes 7a, 7b . . . , and 7f with a diameter of 250 µm, and the copper foils 10 and 20 with a thickness of 22 µm were formed. Subsequently, unillustrated photoresist films are coated on the upper and lower surfaces of the core board 1 on which the copper foils 10 and 20 are formed, and the photoresist films are delineated by using a photolithography technology. While using the delineated photoresist films as etching masks, the upper core board wirings 10a, 10b, 10c, 10d and 10e, electrodes 100a, 100b, 100c and 100d, and the lower core board wirings 20a, 20b . . . , and 20g, which are as shown in FIG. 9C, are formed by using iron (III) chloride and the like on the core board 1. The wiring patterns of the upper core wiring boards 10a, 10b, 10c, 10d and 10e, electrodes 100a, 100b, 100c and 100d and lower core board wirings 20a, 20b . . . , and 20g are not particularly limited. However, in the example shown in FIG. 22, the line width of the lines and spaces is designed to be 100 µm, the space width thereof is designed to be 100 µm, and the diameter of through hole lands is designed to be 550 µm.

Figure 23:
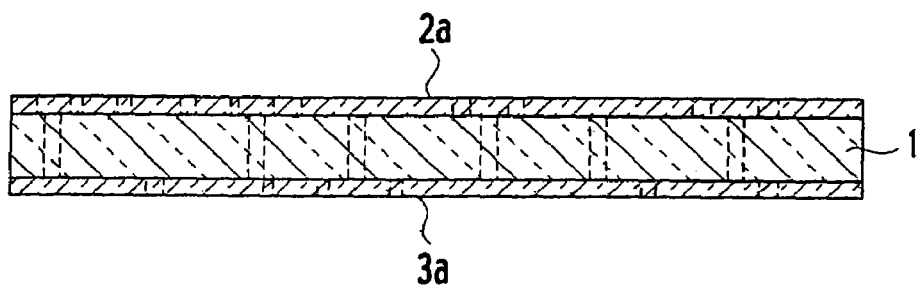

(C) As shown in FIG. 23, by the spin-coating method or the like, the upper optical wiring 2a is formed on positions adjacent to the upper core board wirings 10a, 10b . . . , and 10e and the electrodes 100a, 100b, 100c and 100d on the upper surface of the core board 1. On the positions adjacent to the lower core board wirings 20a, 20b . . . , and 20g on the lower surface of the core board 1, the lower optical wiring board 3a is formed by the spin-coating method or the like. Note that, though only the upper optical wiring 2a and the lower optical wiring 3a appear in the process cross-sectional view shown in FIG. 23 the other upper optical wirings 2b and 2c and the other lower optical wirings are present in the depth of the page space. The method of forming the upper optical wirings 2a, 2b and 2c and lower optical wiring 3a is not particularly limited. However, in the example shown in FIG. 23, each wiring is formed in a manner that a fluorinated polyimide material is coated thereon by the spin-coating method and is then patterned by means of an RIE method. As the upper optical wirings 2a, 2b and 2c and the lower optical wiring 3a, optical fibers made of quartz or the like can also be arranged. Processes that follow are similar to those shown in FIGS. 6 to 13, and accordingly, description thereof is omitted.

OTHER EMBODIMENTS

Various modifications will become possible for those skilled in the art after receiving the teachings of the present disclosure without departing from the scope thereof.

Figure 24:
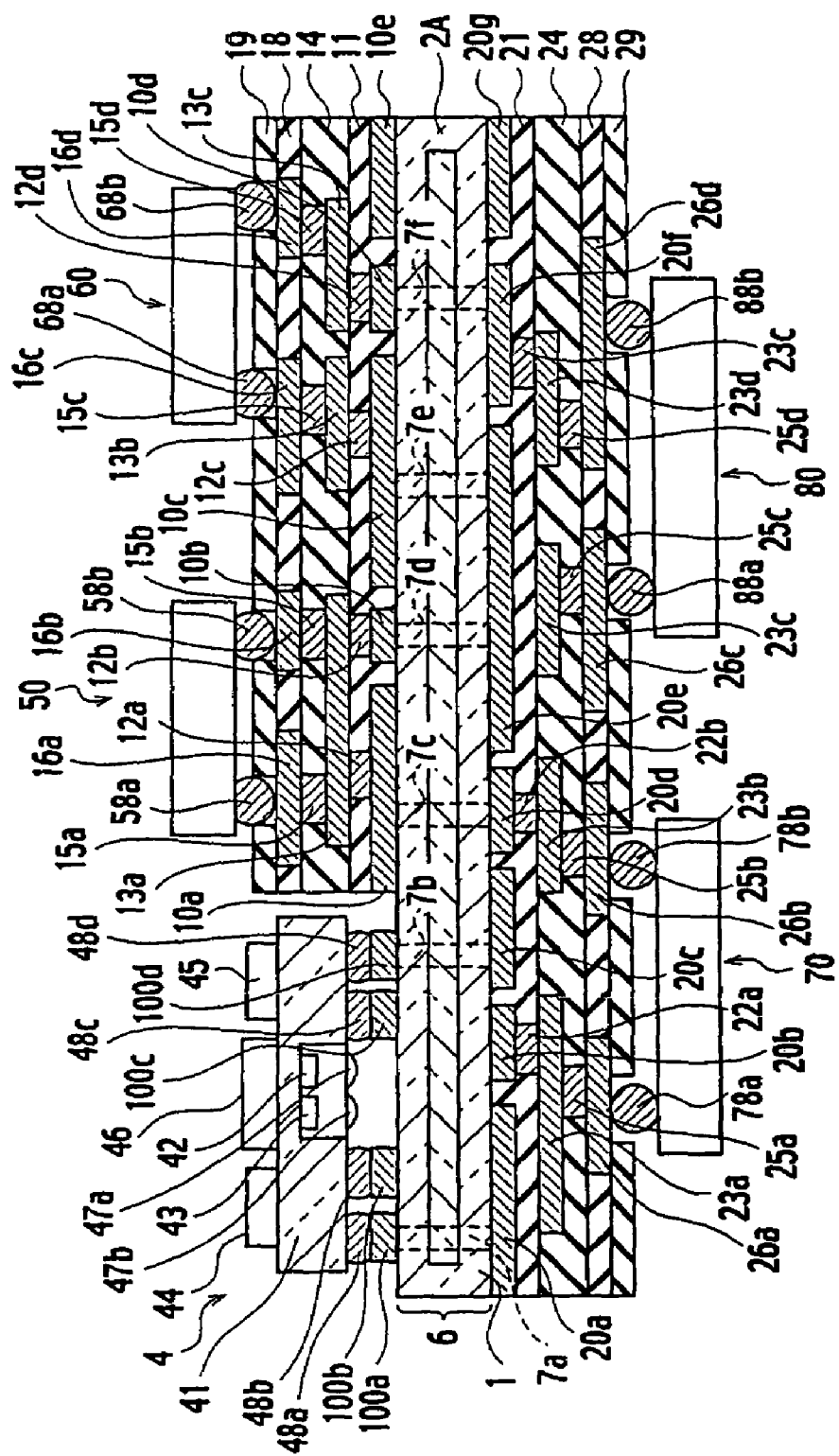
FIG. 24 is a cross-sectional view showing an example of the semiconductor device according to the other embodiments of the present invention.

For example, in the first embodiment, an example of the semiconductor device is shown, in which, for the core composite layer 6, the optical wirings 2A, 2B and 2C are sandwiched between two core boards (the first and second core boards 1a and 1b), and the obtained structure is adhered together. However, as shown in FIG. 24, a semiconductor device using, for the core composite layer 6, one core board 1 into which optical wiring 2A is inserted can also be formed. In the case shown in FIG. 24, a single-mode optical fiber which is made of quartz glass or the like and has a cladding outer diameter of 100 µm Ø is suitable as the optical wiring 2A. Glass fiber of the core board 1 is arranged around the optical fiber. Also in the semiconductor device shown in FIG. 24, a high-density board can be easily realized, in which a warp is reduced, and irregularities on a region on which the optical semiconductor module 4 is to be mounted are small. Moreover, it is also possible to verify that a semiconductor device in which coupling efficiency and connection reliability of the optical semiconductor module 4 and the core board 1 were high could be easily realized.

Moreover, in the first and second embodiments, it is also possible to place underfill resin into a region between the second core board 1b and the optical semiconductor module 5 or between the core board 1 and the optical semiconductor module 4, the region excluding the region on which the surface-emitting laser element array 42 and the light-receiving element array 43 are mounted. The material of the underfill resin is not particularly limited. For example, an epoxy resin which contains a bisphenol series epoxy compound, an imidazole curing catalyst, an acid anhydride curing agent, and 45 wt % of spherical quartz fillers or the like, is usable. For example, a molten epoxy resin obtained by pulverizing, mixing and fusing cresol novolac type epoxy resin (ECON-195XL: made by Sumitomo Chemical Co., Ltd.) of 100 weight parts, phenol resin of 54 weight parts as a curing agent, fused silica of 100 weight parts as fillers, benzylmethylamine of 0.5 weight part as catalyst, and as other additives, carbon black of 3 weight parts and a silane coupling agent of 3 weight parts, and the like, can also be used.

In the first and second embodiments, it is also possible to appropriately change the material, the number of stacked layers and the like of each of the upper build-up wirings 8A, 8B and 8C and the lower build-up wirings 9A, 9B, 9C and 9D.

The optical wirings 2A, 2B, and 2C connectable to the optical semiconductor module 4 are advantageous to reduce the cross talk noise. Further, in the optical interconnections between chips on boards, the optical wirings 2A, 2B, and 2C are also able to transmit high-speed signals even if optical wirings serving as signal wirings are disposed adjacency. In the first and second embodiments, the optical wirings 2A, 2B, and 2C are suitable for transmitting signals from optical elements, which is disposed outside of the core composite layer 6. On the other hand, upper and lower build-up wirings 8A, 8B, 8C, 18A, 18B, 18C, 9A, 9B, 9C, 9D, 19A, 19B, 19C, and 19D may be mainly used for transmitting electric signals on the core composite layer 6. Therefore, these upper and lower build-up wirings 8A, 8B, 8C, 18A, 18B, 18C, 9A, 9B, 9C, 9D, 19A, 19B, 19C, and 19D can be connectable to the semiconductor module 50, 60, 70, 80, 110, 120, 150, and 180, which are operated by electric signals.

What is claimed is:

1. A semiconductor device comprising:
    a core composite layer including a first core board, an optical transmission portion disposed on the first core board, and a second core board disposed on the optical transmission portion, a first mounting region and a second mounting region are assigned on an upper surface of the second core board;
    a plurality of first electrodes disposed on the first mounting region;
    an optical semiconductor module having a module board made from the same material as the first and second core boards, disposed on the first electrodes and being connected optically to the optical transmission portion;
    upper core board wirings disposed on the second mounting region;
    upper build-up wirings stacked on the upper core board wirings, having a second electrode;
    lower core board wirings disposed beneath the first core board;
    lower build-up wirings stacked beneath the lower core board wirings; and
    an upper semiconductor module disposed on the second electrodes.

2. The semiconductor device of claim 1, wherein the first electrodes are disposed on a center area of an upper surface of the core composite layer.

3. The semiconductor device of claim 1, wherein the lower core board wirings and the lower build-up wirings are disposed away from an area opposing the optical semiconductor module on a lower surface of the core composite layer.

4. A semiconductor device comprising:
    a core composite layer including a core board, a lower optical transmission portion disposed beneath a lower surface of the core board, and an upper optical transmission portion disposed on an upper surface of the core board, a first mounting region and a second mounting region are assigned on the upper surface of the core board;
    a plurality of first electrodes disposed on the first mounting region;
    an optical semiconductor module having a module board made from the same material as the core board, disposed on the first electrodes and being connected optically to the at least one of the upper and lower optical transmission portions;
    upper core board wirings disposed on the second mounting region;
    upper build-up wirings stacked on the upper core board wirings, having a second electrode;
    lower core board wirings disposed beneath the core board;
    lower build-up wirings stacked beneath the lower core board wirings; and
    an upper semiconductor module disposed on the second electrodes.

5. A semiconductor device comprising:
    a core composite layer including a core board and an optical transmission portion buried in a center of the core board, a first mounting region and a second mounting region are assigned on an upper surface of the core board;
    a plurality of first electrodes disposed on the first mounting region;
    an optical semiconductor module having a module board made from the same material as the core board, disposed on the first electrodes and being connected optically to the optical transmission portion;
    upper core board wirings disposed on the second mounting region;
    upper build-up wirings stacked on the upper core board wirings, having a second electrode;
    lower core board wirings disposed beneath the core board;
    lower build-up wirings stacked beneath the lower core board wirings; and
    an upper semiconductor module disposed on the second electrodes.

6. The semiconductor device of claim 1, wherein the core board includes a hard base material made from a glass epoxy board.

7. The semiconductor device of claim 1, further comprising an underfill resin disposed between the first electrodes and the optical semiconductor module.

8. The semiconductor device of claim 1, wherein the optical transmission portion is connectable to the outside of the core composite layer and the upper and lower build-up wirings are connectable to the upper and lower semiconductor modules, respectively.

9. The semiconductor device of claim 1, further comprising:
    a plurality of through holes connected to the upper and lower core board wirings and penetrating through the first and second core boards so as to avoid a region where the optical transmission portion is arranged.

10. The semiconductor device of claim 9, wherein the optical transmission portion includes a plurality of line-shaped optical wirings aligned parallel to each other.

* * * * *